(12) United States Patent
Yoshida

(10) Patent No.: US 11,169,424 B2
(45) Date of Patent: Nov. 9, 2021

(54) DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/819,273

(22) Filed: Mar. 16, 2020

(65) Prior Publication Data

US 2020/0301217 A1 Sep. 24, 2020

Related U.S. Application Data

(60) Provisional application No. 62/819,705, filed on Mar. 18, 2019.

(51) Int. Cl.
*H01L 27/12* (2006.01)
*H01L 29/786* (2006.01)
(Continued)

(52) U.S. Cl.
CPC ...... *G02F 1/136227* (2013.01); *G02F 1/1368* (2013.01); *G02F 1/136209* (2013.01);
(Continued)

(58) Field of Classification Search
CPC ............ H01L 29/786; H01L 29/78633; H01L 29/78645; H01L 29/78696; H01L 29/7869; H01L 27/124; H01L 27/1222; H01L 27/1225; H01L 27/1248; H01L 27/3248; H01L 27/3272; H01L 27/3276; H01L 27/3279; H01L 2027/11875; H01L 2027/11879; H01L 2027/11883; H01L 2027/1214; H01L 2027/11885; H01L 2027/11887; H01L 2027/11827; H01L 2027/11862; H01L 2027/11866; H01L 2027/11874; H01L 2027/11881; H01L 27/12; H01L 27/1214; H01L 27/1218; H01L 27/1255; G02F 1/136227; G02F 1/1368; G02F 1/136209; G02F 1/136218; G02F 1/1362; G02F 2203/01; G02F 2202/10; G02F 2201/121; G02F 1/134309; G02F 1/133514; G02F 1/133707; G02F 1/133788; G02F 1/136213; G02F 1/136286; G02F 1/13439; G02F 1/134336; G02F 1/133512; G02F 2001/13606;
(Continued)

(56) References Cited

U.S. PATENT DOCUMENTS 6,633,360 B2 * 10/2003 Okada ............... G02F 1/136227
349/145
8,946,703 B2 * 2/2015 Miyairi ............. H01L 29/42384
257/43
(Continued)

FOREIGN PATENT DOCUMENTS

JP 2007-079568 A 3/2007

*Primary Examiner* — Natalia A Gondarenko
(74) *Attorney, Agent, or Firm* — Keating & Bennett, LLP

(57) ABSTRACT

A display device includes a pixel electrode, a switching element connected to the pixel electrode, a pixel line connected to the switching element and disposed adjacent to the pixel electrode, and a light-transmitting shielding portion made of a conductive film having light-transmitting and disposed adjacent to both the pixel electrode and the pixel line.

14 Claims, 19 Drawing Sheets

(51) Int. Cl.
*G02F 1/1362* (2006.01)
*G02F 1/1345* (2006.01)
*G02F 1/1333* (2006.01)
*G02F 1/1368* (2006.01)

(52) U.S. Cl.
CPC ........ H01L 27/124 (2013.01); H01L 27/1248 (2013.01); H01L 29/78633 (2013.01); H01L 29/78645 (2013.01); H01L 29/78696 (2013.01); *G02F 2201/121* (2013.01); *H01L 27/1225* (2013.01); *H01L 29/7869* (2013.01)

(58) Field of Classification Search
CPC ........ G02F 2001/136272; G02F 2001/133742; G02F 2201/52
USPC ................................ 257/72, 532, 59, 43, 79
See application file for complete search history.

(56) References Cited

U.S. PATENT DOCUMENTS

| | | | |
|---|---|---|---|
| 9,360,726 B2* | 6/2016 | Takizawa | G02F 1/1345 |
| 2007/0057257 A1 | 3/2007 | Kim | |
| 2007/0070282 A1* | 3/2007 | Shibahara | G02F 1/134363 |
| | | | 349/141 |
| 2013/0088660 A1* | 4/2013 | Kaneko | H01L 27/1255 |
| | | | 349/43 |
| 2018/0210252 A1* | 7/2018 | Tanaka | H01L 27/1225 |
| 2019/0172851 A1* | 6/2019 | Yamayoshi | G02F 1/133345 |

* cited by examiner

DISPLAY DEVICE

CROSS-REFERENCE TO RELATED APPLICATION

The present application claims priority to U.S. Provisional Application Ser. No. 62/819,705, filed Mar. 18, 2019, the content to which is hereby incorporated by reference into this application.

BACKGROUND OF THE INVENTION

Field of the Invention

The present disclosure relates to a display device.

Description of the Related Art

As an example of a display device in the prior art, there is known the display device described in Japanese Unexamined Patent Application Publication No. 2007-79568. The display device described in Japanese Unexamined Patent Application Publication No. 2007-79568 includes a substrate made of insulator, a plurality of gate lines formed on the substrate, a plurality of data lines intersecting the plurality of gate lines, a plurality of thin film transistors, a gate and a source of each of the plurality of thin film transistors are respectively connected to a gate line of the plurality of gate lines and a data line of the plurality of data lines, and a plurality of pixel electrodes having a rectangular shape, each connected to a drain of a thin film transistor of the plurality of thin film transistors, arranged in a matrix, and including a first side parallel to a gate line of the plurality of gate lines and a second side shorter than the first side and parallel to a data line of the plurality of data lines. The pixel electrodes adjacent to each other in a column direction are connected to data lines different from each other.

SUMMARY OF THE INVENTION

In the display device set forth in Japanese Unexamined Patent Application Publication No. 2007-79568 described above, each of the pixel electrodes overlaps a storage electrode line including a storage electrode, thereby forming a storage capacitor that enhances a voltage storing capacity of a liquid crystal capacitor. In particular, a stem of the storage electrode line traverses longitudinally across a center of the pixel electrode, and top and bottom boundaries of the pixel electrode are positioned on the storage electrodes extending to the right and left from the stem. When the storage electrode lines are thus arranged, electromagnetic interference formed between the gate lines and the pixel electrodes is blocked by the storage electrodes, thereby stably maintaining the voltage of the pixel electrodes. However, the storage electrode line described above is constituted by a metal film having a light-blocking property, and there is concern that, with the storage electrode partially overlapping the pixel electrode, the amount of transmitted light of the pixel electrode is decreased and luminance reduction is generated.

One aspect of the present disclosure has been completed on the basis of the circumstances described above, and an object of the present disclosure is to block an electrical field while suppressing a luminance reduction.

(1) An embodiment of the present disclosure is a display device including a pixel electrode, a switching element connected to the pixel electrode, a pixel line connected to the switching element and disposed adjacent to the pixel electrode, and a light-transmitting shielding portion made of a conductive film having light-transmitting and disposed adjacent to both the pixel electrode and the pixel line.

(2) Further, in an embodiment of the present disclosure, in addition to the configuration of (1) described above, in the display device, the switching element includes at least a channel region made of a portion of a semiconductor film, and the light-transmitting shielding portion is formed by reducing a resistance of a portion of the semiconductor film, the portion being different from the channel region.

(3) Further, in an embodiment of the present disclosure, in addition to the configuration of (1) or (2) described above, in the display device, the pixel line is disposed aligned with the pixel electrode with an interval between the pixel line and the pixel electrode, and the light-transmitting shielding portion includes a non-overlapping portion interposed between and not overlapping the pixel electrode and the pixel line in an alignment direction of the pixel electrode and the pixel line.

(4) Further, in an embodiment of the present disclosure, in addition to any one of the configurations of (1) to (3) described above, in the display device, the light-transmitting shielding portion includes a pixel electrode overlapping portion overlapping an edge portion of the pixel electrode with an insulating film interposed between the pixel electrode overlapping portion and the edge portion of the pixel electrode.

(5) Further, in an embodiment of the present disclosure, in addition to any one the configurations of (1) to (4) described above, in the display device, the light-transmitting shielding portion includes a pixel line overlapping portion overlapping an edge portion of the pixel line with an insulating film interposed between the pixel line overlapping portion and the edge portion of the pixel line.

(6) Further, in an embodiment of the present disclosure, in addition to the configuration of (5) described above, in the display device, the switching element includes at least a channel region made of a portion of a semiconductor film disposed on an upper layer side of the pixel line with an insulating film interposed between the channel region and the pixel line, and the light-transmitting shielding portion is formed by reducing a resistance of a portion of the semiconductor film, the portion being different from the channel region.

(7) Further, in an embodiment of the present disclosure, in addition to any one of the configurations of (1) to (6) described above, in the display device, the pixel electrode has a longitudinal shape, and the pixel line and the light-transmitting shielding portion extend along an edge portion on a longitudinal side of the pixel electrode.

(8) Further, in an embodiment of the present disclosure, in addition to the configuration of (7) described above, in the display device, the pixel electrode includes a bent portion at a middle of the pixel electrode in a longitudinal direction, and the pixel line and the light-transmitting shielding portion are bent along the bent portion.

(9) Further, in an embodiment of the present disclosure, in addition to the configuration of (7) or (8) described above, the display device further includes a second pixel line extending in a short-hand direction of the pixel electrode, and the switching element includes a first gate electrode connected to the pixel line, a channel region disposed overlapping the first gate electrode on an upper layer side with a first gate insulating film interposed between the channel region and the first gate electrode and made of a semiconductor film, a second gate electrode disposed overlapping the channel region on an upper layer side with the second gate insulating film interposed between the second gate electrode and the channel region and connected to the first gate electrode, a source region connected to a first end portion of the channel region and the second pixel line, and a drain region connected to a second end portion of the channel region and the pixel electrode.

(10) Further, in an embodiment of the present disclosure, in addition to the configuration of (9) described above, in the display device, the second pixel line is disposed with an insulating film interposed between the second pixel line and the second gate electrode, and is made of an conductive film different from that of the second gate electrode.

(11) Further, in an embodiment of the present disclosure, in addition to the configuration of (9) described above, in the display device, the second pixel line is made of the conductive film same as that of the second gate electrode.

(12) Further, in an embodiment of the present disclosure, in addition to the configuration of any one of (1) to (11) described above, the display device further includes a common electrode overlapping the pixel electrode with an insulating film interposed between the common electrode and the pixel electrode, and the light-transmitting shielding portion is connected to the common electrode.

(13) Further, in an embodiment of the present disclosure, in addition to the configuration of any one of (1) to (12) described above, the display device further includes a second shielding portion disposed at least partly overlapping the light-transmitting shielding portion with an insulating film interposed between the second shielding portion and the light-transmitting shielding portion, and made of a conductive film.

(14) Further, in an embodiment of the present disclosure, in addition to the configuration of (13) described above, in the display device, the second shielding portion is constituted by a conductive film having light-blocking properties, and includes a light-blocking pixel line overlapping portion overlapping an edge portion of the pixel line with an insulating film interposed between the light-blocking pixel line overlapping portion and the edge portion of the pixel line, and the light-transmitting shielding portion includes a light-transmitting pixel electrode overlapping portion overlapping an edge portion of the pixel electrode with an insulating film interposed between the light-transmitting pixel electrode overlapping portion and the edge portion of the pixel electrode.

(15) Further, in an embodiment of the present disclosure, in addition to the configuration of (13) or (14) described above, the display device further includes a common electrode overlapping the pixel electrode with an insulating film interposed between the common electrode and the pixel electrode, and an intermediate electrode disposed overlapping the common electrode and the light-transmitting shielding portion via different insulating films and connected to each of the common electrode and the light-transmitting shielding portion through a contact hole formed in each of the insulating films. The second shielding portion is made of the conductive film same as that of the intermediate electrode, and is coupled to the intermediate electrode.

According to one aspect of the present disclosure, it is possible to block an electrical field while suppressing a luminance reduction.

DETAILED DESCRIPTION OF THE INVENTION

First Embodiment

The first embodiment of the present disclosure will be described with reference to FIG. 1 to FIG. 13. In the present embodiment, a liquid crystal display device 10 is exemplified. Note that the X axis, the Y axis, and the Z axis are illustrated in a part of each drawing, and each axial direction is illustrated to be the direction illustrated in each drawing. Further, an upper side and a lower side in FIG. 3, FIG. 4, FIG. 9, FIG. 10, FIG. 11, FIG. 12, and FIG. 13 are a front side and a rear side, respectively.

Figure 1:
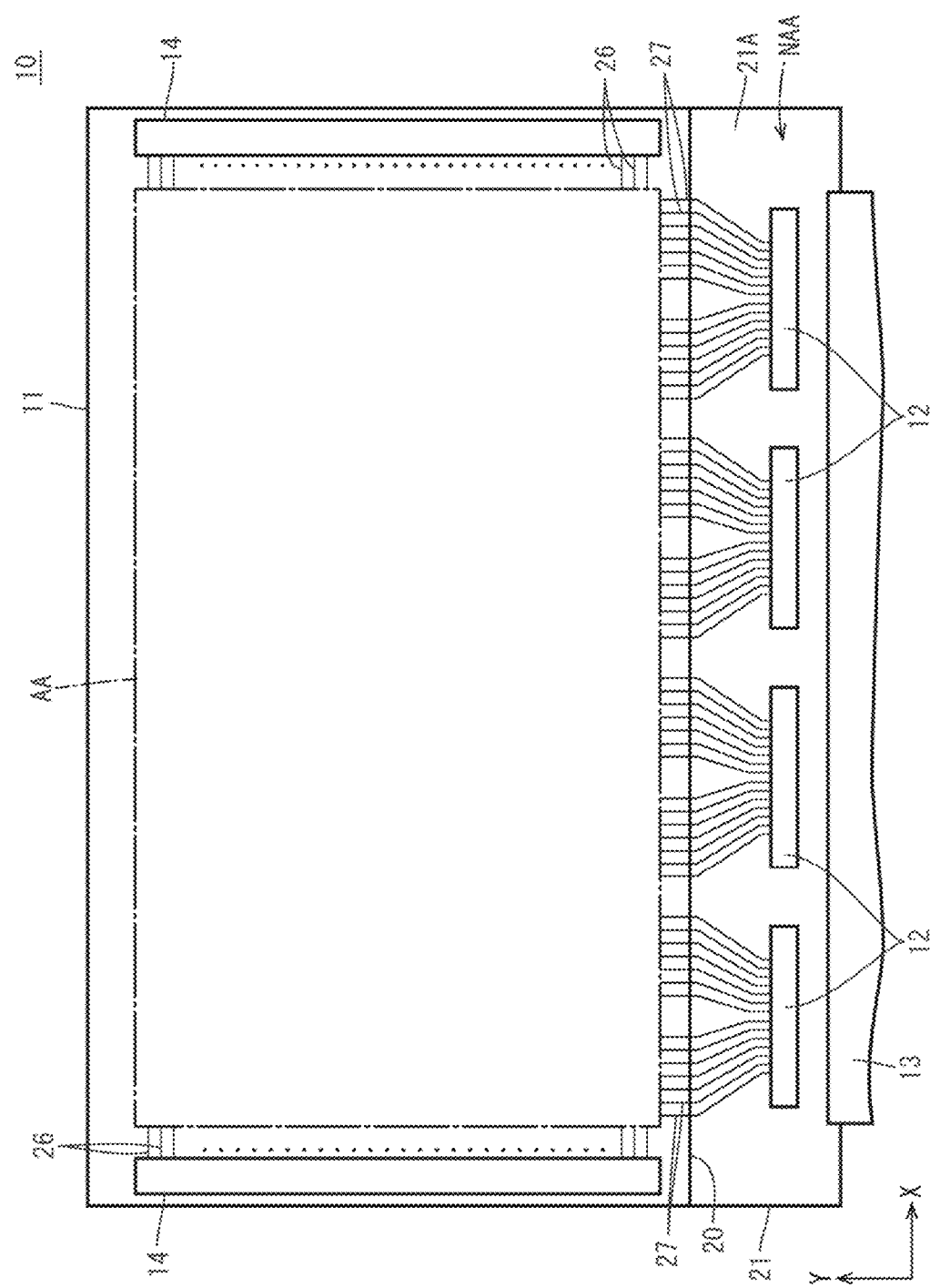
FIG. 1 is a cross-sectional view of a liquid crystal panel according to a first embodiment of the present disclosure.

FIG. 1 is a schematic plan view of a liquid crystal panel 11. The liquid crystal display device 10, as illustrated in FIG. 1, includes at least the liquid crystal panel (display device, display panel) 11 that has a horizontally elongated rectangular shape and is capable of displaying an image, and a backlight device (illumination device), which is an external light source configured to irradiate the liquid crystal panel 11 with light for use in display. In the present embodiment, the liquid crystal panel 11 has, for example, a screen size of about 15 inches (specifically, 15.6 inches), and a resolution equivalent to "full high definition (FHD)". The backlight device includes a light source (for example, a light emitting diode (LED) or the like) disposed on a rear side (back face side) of the liquid crystal panel 11 and configured to emit light having a white color (white light), an optical member configured to impart an optical effect on the light from the light source, thereby converting the light into planar light, and the like.

In the liquid crystal panel 11, as illustrated in FIG. 1, a center portion of a screen is established as a display region (range surrounded by a dot-dash line in FIG. 1) AA in which images are displayed. In contrast, a frame-shaped outer peripheral portion surrounding the display region AA of the screen of the liquid crystal panel 11 is a non-display region NAA in which images are not displayed. In the present embodiment, a long side dimension of the display region AA is 345.6 mm, for example, and a short side dimension is 194.4 mm, for example. The liquid crystal panel 11 is formed by bonding a pair of substrates 20 and 21 together. A front side (front face side) of the pair of substrates 20 and 21 is the color film (CF) substrate (counter substrate) 20, and a rear side (back face side) is the array substrate (active matrix substrate, element substrate) 21. The CF substrate 20 and the array substrate 21 are each formed by layering various films on an inner surface side of the glass substrate. Note that polarizers are bonded to outer face sides of both the substrates 20 and 21, respectively.

The CF substrate 20, as illustrated in FIG. 1, has a short side dimension that is shorter than a short side dimension of the array substrate 21, and is bonded to the array substrate 21 with one end portion in a short side direction (Y-axis direction) aligned with the array substrate 21. Accordingly, the other end portion in the short side direction of the array substrate 21 is a CF substrate non-overlapping portion 21A protruding laterally relative to the CF substrate 20 and not overlapping the CF substrate 20. A driver (second signal supplying portion) 12 and a flexible substrate (signal transmitting portion) 13 are mounted to this CF substrate non-overlapping portion 21A. The driver 12 is constituted by a large-scale integration (LSI) chip including a drive circuit in an interior thereof, is chip-on-glass (COG) mounted to the array substrate 21, and processes various signals transmitted by the flexible substrate 13. In the present embodiment, in the non-display region NAA of the liquid crystal panel 11, four of the drivers 12 are disposed aligned and intervals therebetween in the X-axis direction. The flexible substrate 13 has a configuration in which a line pattern including a plurality of lines are formed on a substrate made of a synthetic resin material (for example, a polyimide resin or the like) having insulating properties and flexibility. The flexible substrate 13 is connected to the non-display region NAA of the liquid crystal panel 11 at one end side, and connected to a control substrate (signal supply source) at the other end side. Various signals supplied from the control substrate are transmitted to the liquid crystal panel 11 via the flexible substrate 13 and outputted to the display region AA after being processed by the drivers 12 in the non-display region NAA. Further, in the non-display region NAA of the array substrate 21, a pair of gate circuit portions (signal supplying portions) 14 are provided sandwiching the display region AA from both sides in the X-axis direction. The gate circuit portions 14 are each configured to supply a scanning signal to a gate line 26 described later, and monolithically provided to the array substrate 21.

Figure 2:
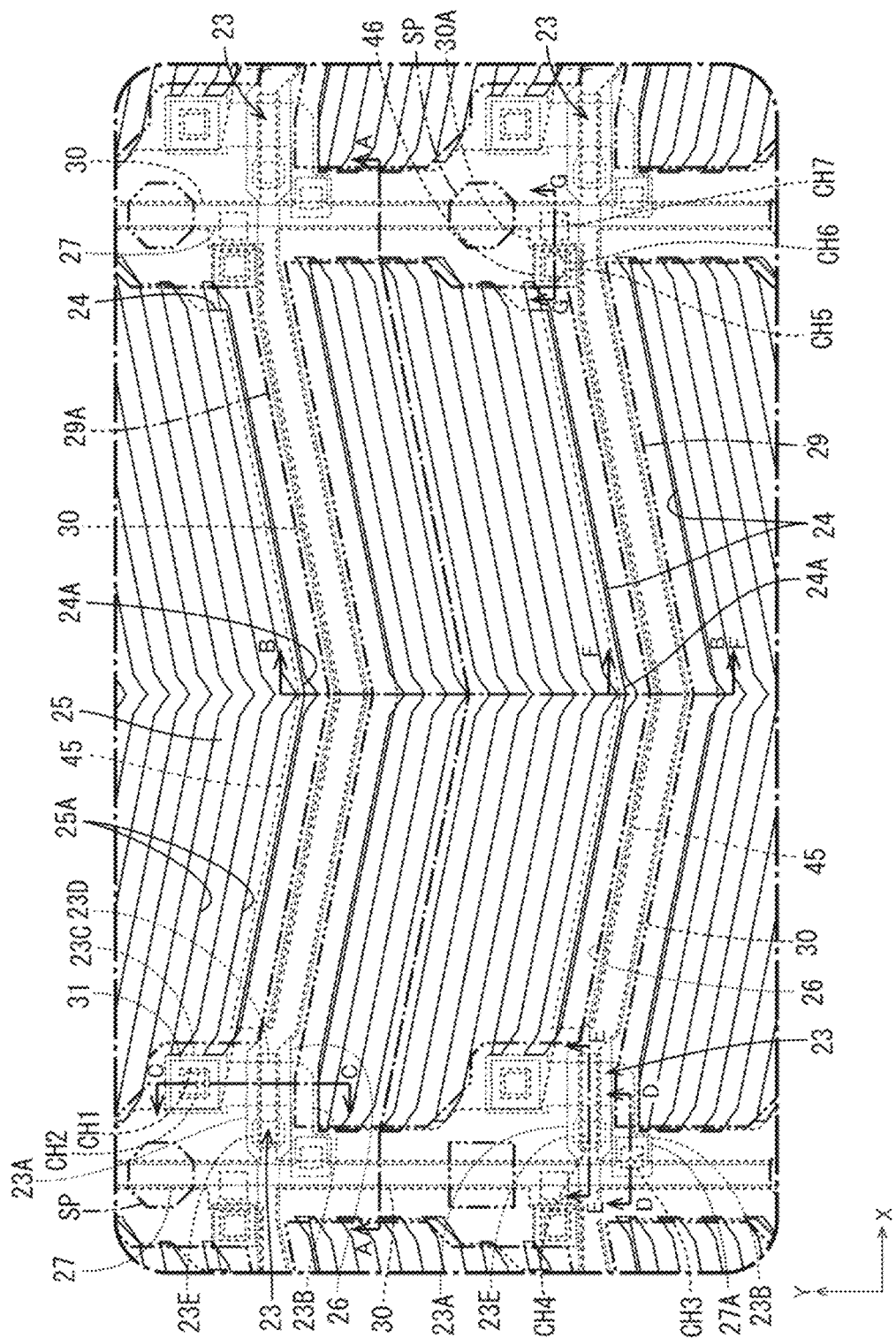
FIG. 2 is a plan view illustrating a pixel arrangement in an array substrate and a CF substrate constituting the liquid crystal panel.

FIG. 2 is a plan view of the display region AA of the array substrate 21 and the CF substrate 20 constituting the liquid crystal panel 11. As illustrated in FIG. 2, a thin film transistor (TFT; switching element) 23 and a pixel electrode 24 are provided on an inner surface side of the display region AA of the array substrate 21 constituting the liquid crystal panel 11. A plurality of the TFTs 23 and the pixel electrodes 24 are provided in a matrix shape with intervals therebetween in the X-axis direction and the Y-axis direction. A gate line (pixel line, scanning line) 26 and a source line (second pixel line, signal line, data line) 27 orthogonal to (intersecting) each other are provided around the TFTs 23 and the pixel electrodes 24. While the gate line 26 extends almost along in the X-axis direction, the source line 27 extends almost along in the Y-axis direction. In the present embodiment, the resolution of the liquid crystal panel 11 is equivalent to "FHD", three-color color filters 28 are configured so that those of different colors are arranged repeatedly along the source line 27 (Y-axis direction) as described later, and thus the number of installations of the gate line 26 is "1080× 3=3240" and the number of installations of the source line 27 is "1920". The gate line 26 and the source line 27 are respectively connected to a first gate electrode 23A as well as a second gate electrode 23E and a source region 23B of the TFT 23, and the pixel electrode 24 is connected to a drain region 23C of the TFT 23. The TFT 23 is driven on the basis of various signals respectively supplied to the gate line 26 and the source line 27 and, with the driving of the TFT 23, the supply of electrical potential to the pixel electrode 24 is controlled. Further, the TFT 23 is disposed adjacent to one side (left side in FIG. 2) in the X-axis direction of the pixel electrode 24 to be connected. Further, a spacer SP for maintaining an interval between the pair of substrates 20 and 21 is provided in each position of the CF substrate 20 that overlaps the source line 27 of the array substrate 21 and is offset to an upper side illustrated in FIG. 2 relative to the TFT 23.

The pixel electrode 24, as illustrated in FIG. 2, has a horizontally long shape in plan view, with a longitudinal direction thereof matching the X-axis direction and a shorthand direction thereof matching the Y-axis direction. A ratio of a longitudinal dimension to a short-hand dimension of the pixel electrode 24 is 3. The gate line 26 and the like are interposed between the pixel electrodes 24 adjacent to each other in the short-hand direction (Y-axis direction) while the source line 27 and the like are interposed between the pixel electrodes 24 adjacent to each other in the longitudinal direction (X-axis direction). The pixel electrodes 24 are each disposed with a side edge portion on a longitudinal side adjacent to the gate line 26 with a predetermined interval therebetween in the Y-axis direction, and with a side edge portion on a short-hand side adjacent to the source line 27 with a predetermined interval therebetween in the X-axis direction. Then, the pixel electrodes 24 each have a planar shape that is a bent shape with a bent portion 24A at a middle in the longitudinal direction. Specifically, the pixel electrodes 24 are each slightly inclined relative to the X-axis direction at both side edge portions in the longitudinal direction thereof, and bent once at a substantially central position, thereby forming a shallow V-shape in which the apex angle is an obtuse angle The pixel electrodes 24 each include the bent portion 24A in a substantially central position in the longitudinal direction and have a planar shape in which two generally parallelogram portions are connected, making the shape generally line symmetric relative to a virtual centerline extending in the short-hand direction through the bent portion 24A. The bent portion 24A is positioned at a joining point of the two generally parallelogram portions described above, and forms a straight line connecting the bending points at both side edge portions on the longitudinal side of the pixel electrode 24 in the short-hand direction of the pixel electrode 24. The gate line 26 interposed between the pixel electrodes 24 adjacent in the short-hand direction is parallel to the side edge portions on the longitudinal sides of the pixel electrodes 24, and is repeatedly bent in a zigzag manner following along the side edge portion on the longitudinal sides of the pixel electrodes 24. The arrangement interval of the gate line 26 is about the same as the short-hand dimension of the pixel electrode 24, and the arrangement interval of the source line 27 is about the same as the longitudinal dimension of the pixel electrode 24. Accordingly, compared to when a pixel electrode is given a longitudinally long shape, the arrangement interval of the source line 27 is about the ratio of the short-hand dimension of the pixel electrode 24 divided by the longitudinal dimension (for example, approximately ⅓), and thus the number of installations of the source line 27 per unit length in the X-axis direction is about the same as the ratio described above (approximately ⅓, for example). Note that, compared to when a pixel electrode is given a longitudinally long shape, the arrangement interval of the gate line 26 is about the ratio of the longitudinal dimension of the pixel electrode 24 divided by the short-hand dimension (for example, approximately 3), and thus the number of installations of the gate line 26 per unit length in the X-axis direction is about the same as the ratio described above (approximately 3, for example). This makes it possible to reduce the number of installations of the source line 27, and thus the number of image signals supplied to the source lines 27 is reduced. Note that a black matrix (inter-pixel light blocking portion) 29 illustrated by a two-dot chain line in FIG. 2 is formed on the CF substrate 20 side. The black matrix 29 has a planar shape that is substantially a lattice pattern, partitioning the areas between the adjacent pixel electrodes 24, and includes a pixel opening 29A at a position overlapping a large portion of the pixel electrode 24 in plan view. This pixel opening 29A allows the transmitted light of the pixel electrode 24 to be emitted outside the liquid crystal panel 11. The black matrix 29 is disposed overlapping at least the TFT 23, the gate line 26, and the source line 27 (also including a common line 30 described later) on the array substrate 21 side, in plan view.

Figure 3:
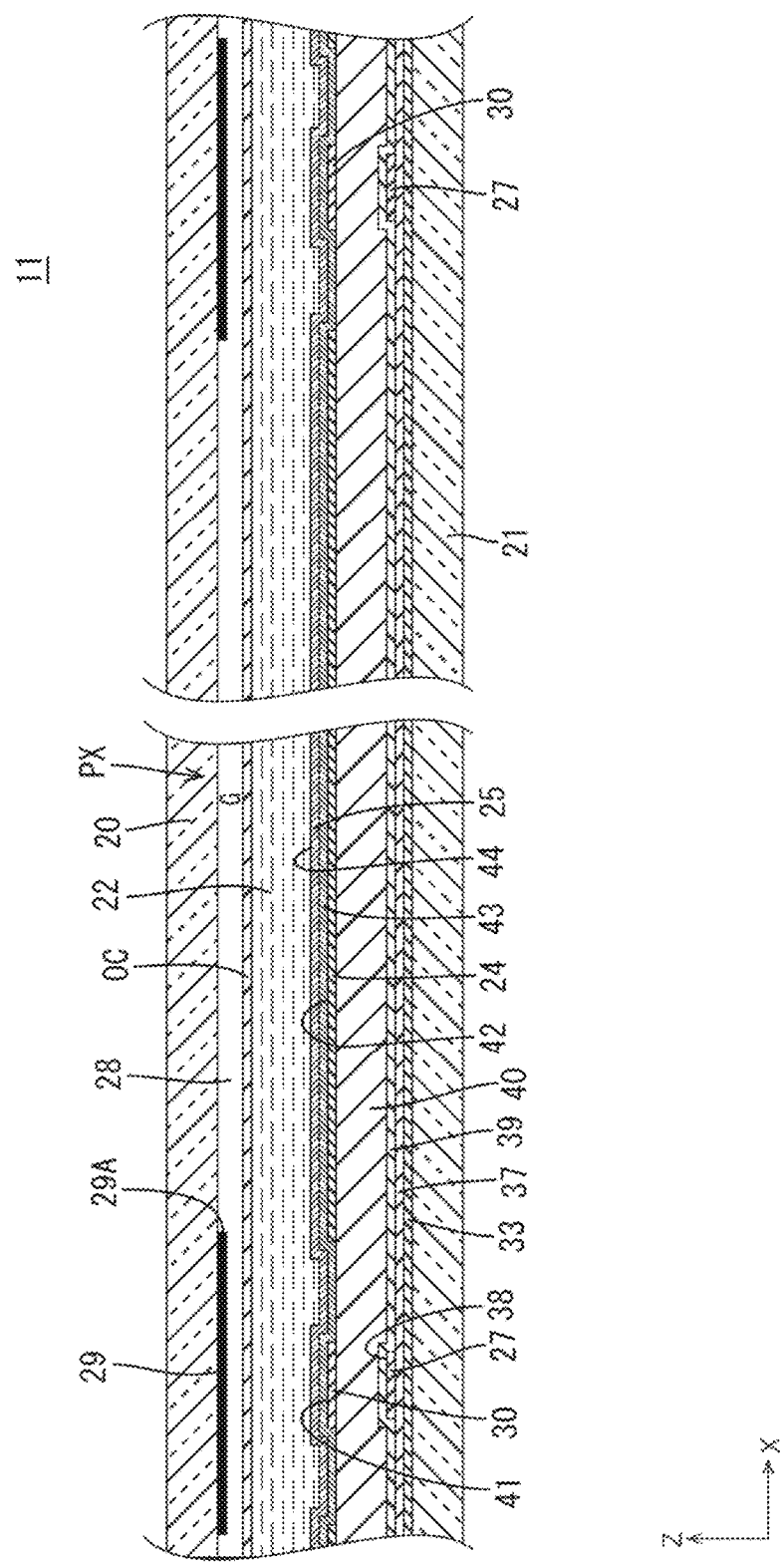
FIG. 3 is a cross-sectional view of the liquid crystal panel taken along line A-A of FIG. 2.
Figure 4:
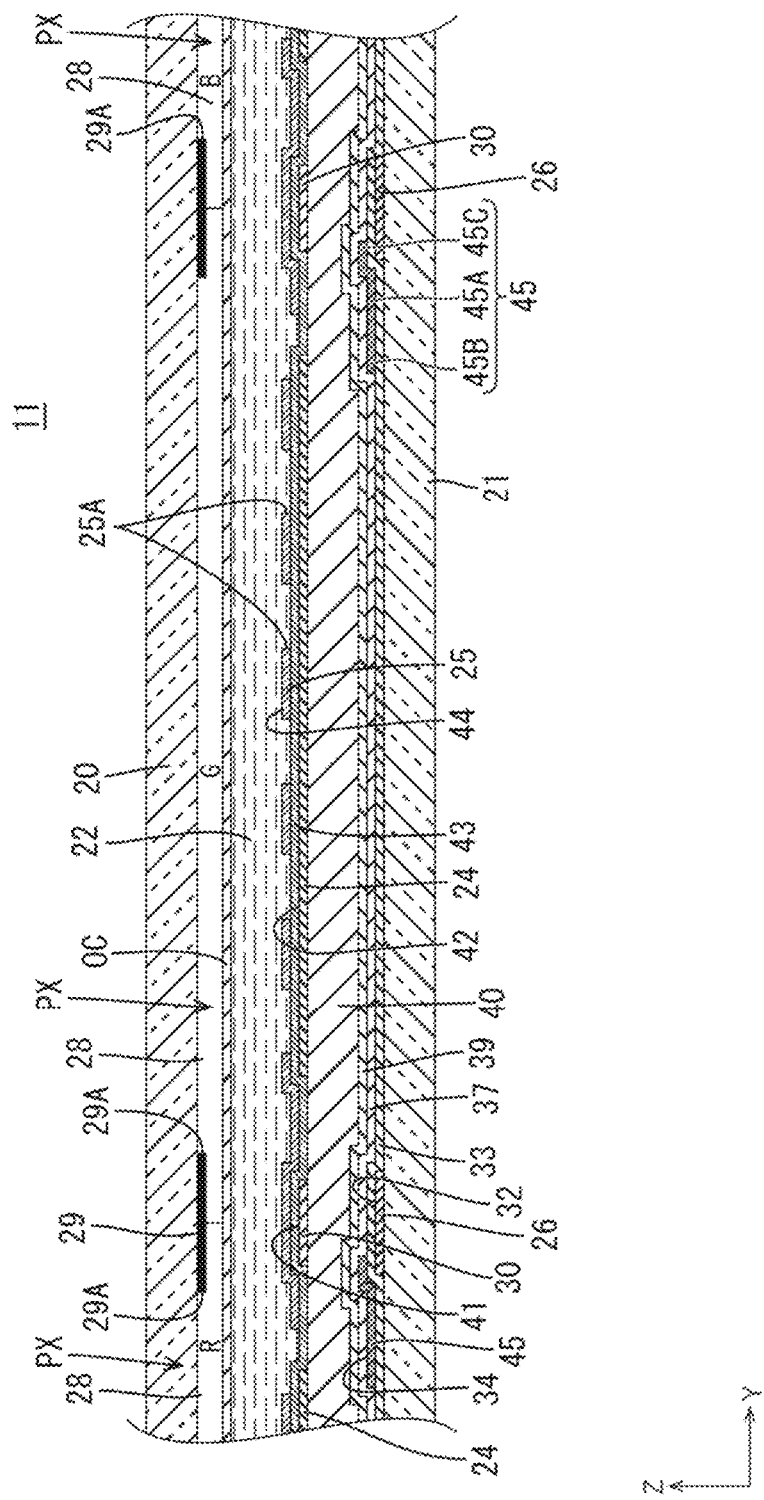
FIG. 4 is a cross-sectional view of the liquid crystal panel taken along line B-B of FIG. 2.

FIG. 3 is a cross-sectional view of the liquid crystal panel 11 near a center portion of a pixel portion PX in the Y-axis direction. FIG. 4 is a cross-sectional view of the liquid crystal panel 11 near a center portion of the pixel portion PX in the X-axis direction. As illustrated in FIG. 3 and FIG. 4, the liquid crystal panel 11 includes a liquid crystal layer (medium layer) 22 that is disposed between the pair of substrates 20 and 21 and containing liquid crystal molecules, which are substances having optical characteristics that change in accordance with application of an electrical field. The three-color color filters 28 exhibiting blue (B), green (G), and red (R) are provided to the display region AA on an inner face side of the CF substrate 20 constituting the liquid crystal panel 11. A plurality of the color filters 28 are arranged in alignment in a matrix shape in the X-axis direction and the Y-axis direction, overlapping the pixel electrodes 24 on the array substrate 21 side in plan view. The color filters 28 are arranged so that those exhibiting mutually different colors are repeatedly aligned along the source lines 27 (Y-axis direction), and those exhibiting the same color are continuously aligned along the gate lines 26 (X-axis direction). In this liquid crystal panel 11, the R, G, and B color filters 28 aligned in the Y-axis direction and three pixel electrodes 24 facing each of the color filters 28 respectively constitute the three-color pixel portion PX. Then, in this liquid crystal panel 11 are configured display pixels capable of color display with predetermined gradation by the R, G, and B three-color pixel portions PX adjacent to each other in the Y-axis direction. An arrangement pitch of the pixel portions PX in the Y-axis direction is, for example, about 60 µm, and an arrangement pitch of the pixel portions PX in the X-axis direction is about 180 µm, for example. The black matrix 29 is disposed partitioning the area between the color filters 28 facing the adjacent pixel electrodes 24. A flattening film OC disposed in a solid manner across substantially the entire region of the CF substrate 20 is provided on the upper layer side (liquid crystal layer 22 side) of the color filters 28. Note that alignment films for aligning the liquid crystal molecules included in the liquid crystal layer 22 are respectively formed on innermost faces of both of the substrates 20 and 21 that are in contact with the liquid crystal layer 22.

Figure 5:
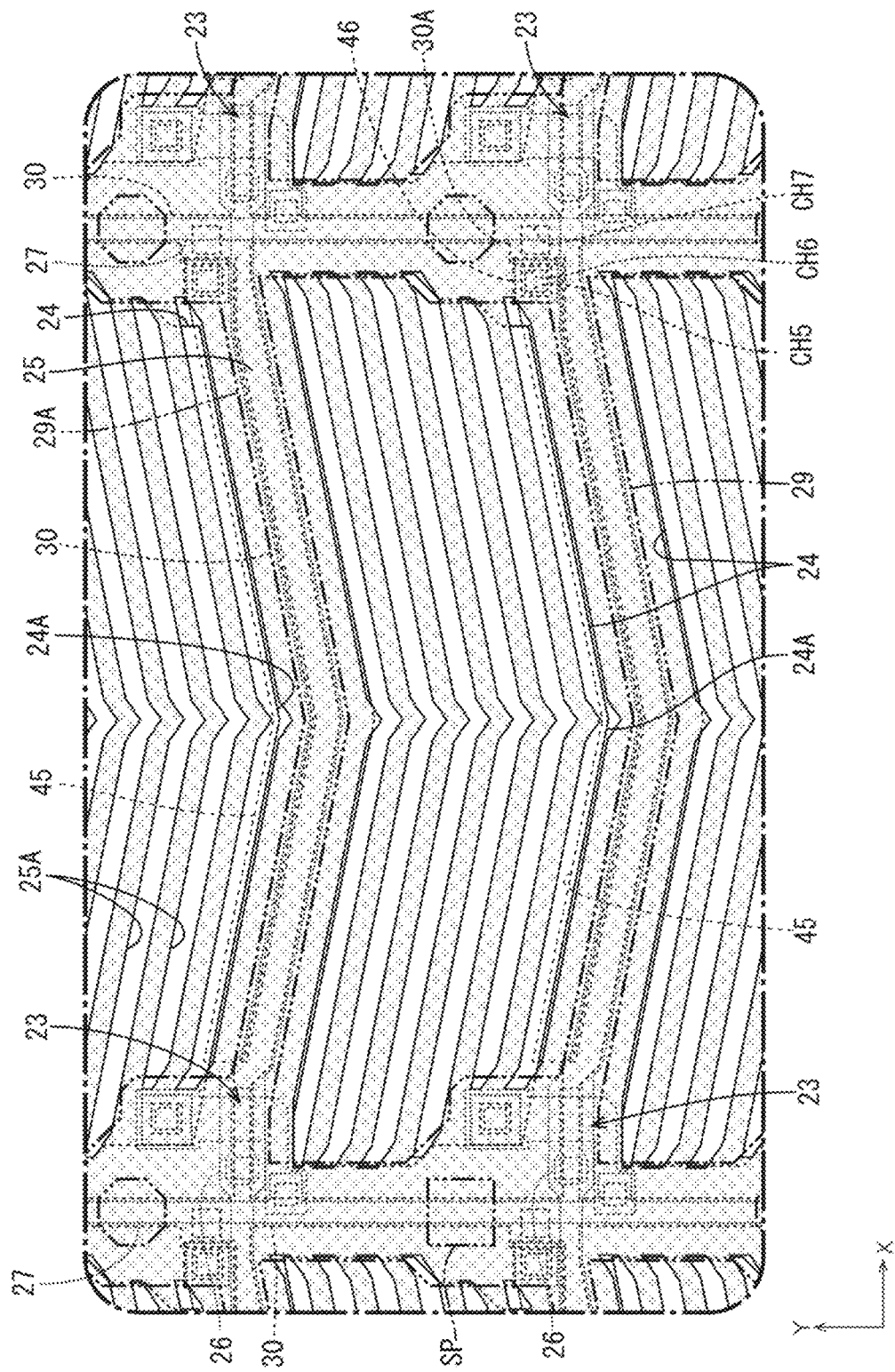
FIG. 5 is a plan view mainly illustrating a pattern of a second transparent electrode film provided to the array substrate.

Next, a common electrode 25 will be described with reference to FIG. 2 to FIG. 5. FIG. 5 is a plan view illustrating a pattern of the common electrode 25 (second transparent electrode film 44 described later) provided to the array substrate 21. In FIG. 5, the second transparent electrode film 44 is illustrated in shaded. On the inner face side of the display region AA of the array substrate 21, as illustrated in FIG. 2 to FIG. 5, the common electrode 25 is formed on the upper layer side of the pixel electrodes 24 in a manner that overlaps all of the pixel electrodes 24. The common electrode 25 is supplied with a substantially constant common potential (reference potential) by the common line 30, and extends across substantially the entire display region AA. The common line 30 overlaps the gate line 26 and the source line 27 described above in the display region AA in plan view, and is generally routed and formed in a substantially lattice pattern. A lead-out portion of the common line 30 led out to the non-display region NAA is connected to the flexible substrate 13, and thus the common line 30 is supplied with a common potential from the flexible substrate 13. A plurality of pixel overlapping openings (pixel overlapping slits, alignment control slits) 25A extending in the longitudinal direction of each pixel electrode 24 are formed in a portion of the common electrode 25 overlapping each pixel electrode 24. The pixel overlapping openings 25A are each parallel to the side edge portion on the longitudinal side of the pixel electrode 24 and bend at a middle (substantially at a central position). Note that the specific installation quantity, shape, formation range and the like of the pixel overlapping opening 25A can be changed as appropriate to other than those illustrated. When a potential difference is generated as the pixel electrodes 24 are charged between the pixel electrodes 24 and the common electrodes 25 overlapping each other, a fringe electrical field (oblique electrical field) including a component along a plate surface of the array substrate 21 as well as a component in a direction normal to the plate surface of the array substrate 21 is generated between opening edges of the pixel overlapping openings 25A and the pixel electrodes 24. Accordingly, by using this fringe electrical field, it is possible to control the alignment state of the liquid crystal molecules included in the liquid crystal layer 22, and a predetermined display is formed on the basis of the alignment state of the liquid crystal molecules. In other words, the operation mode of the liquid crystal panel 11 according to the present embodiment is a fringe field switching (FFS) mode.

Figure 6:
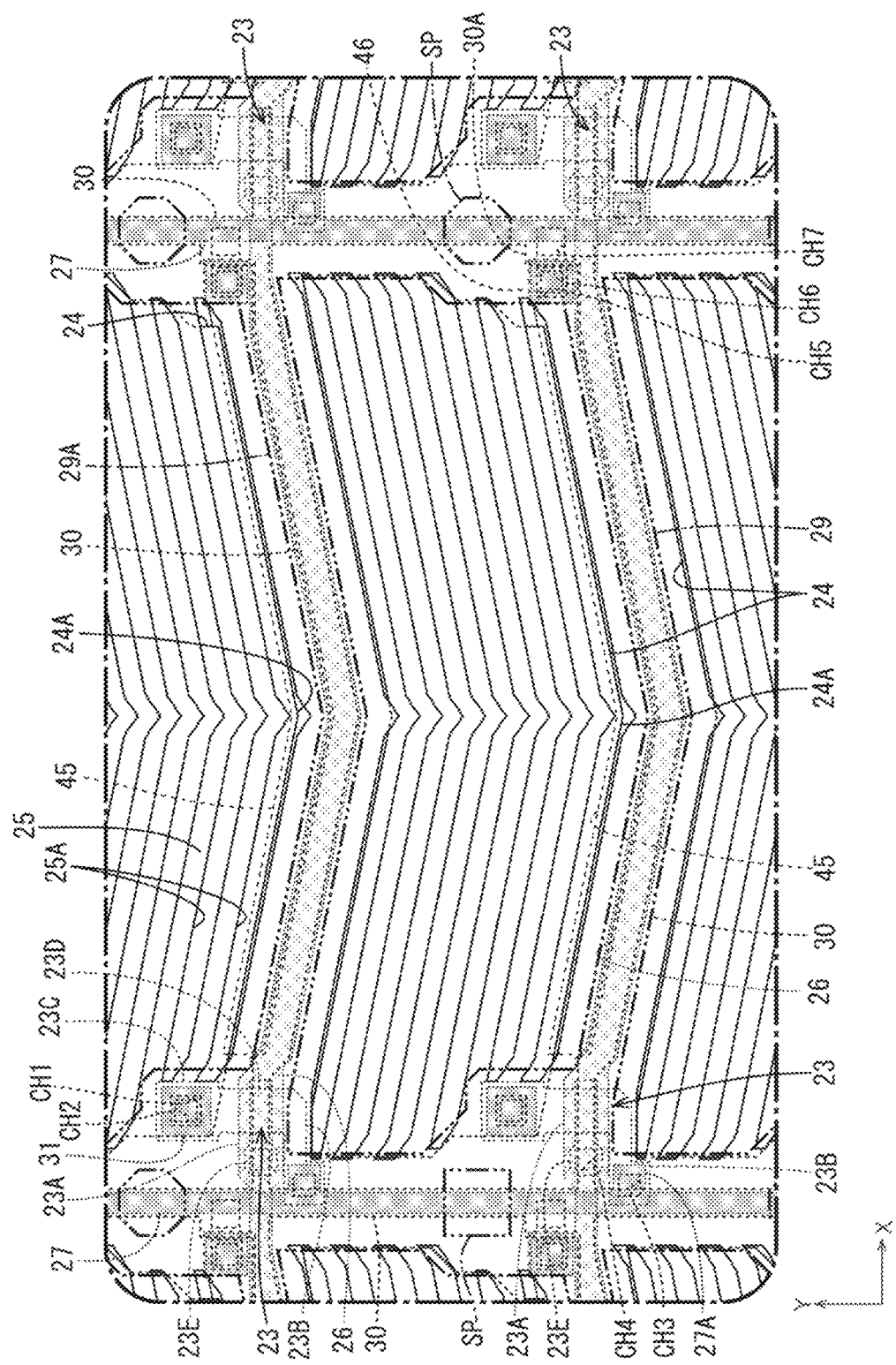
FIG. 6 is a plan view mainly illustrating a pattern of a first metal film and a third metal film provided to the array substrate.
Figure 7:
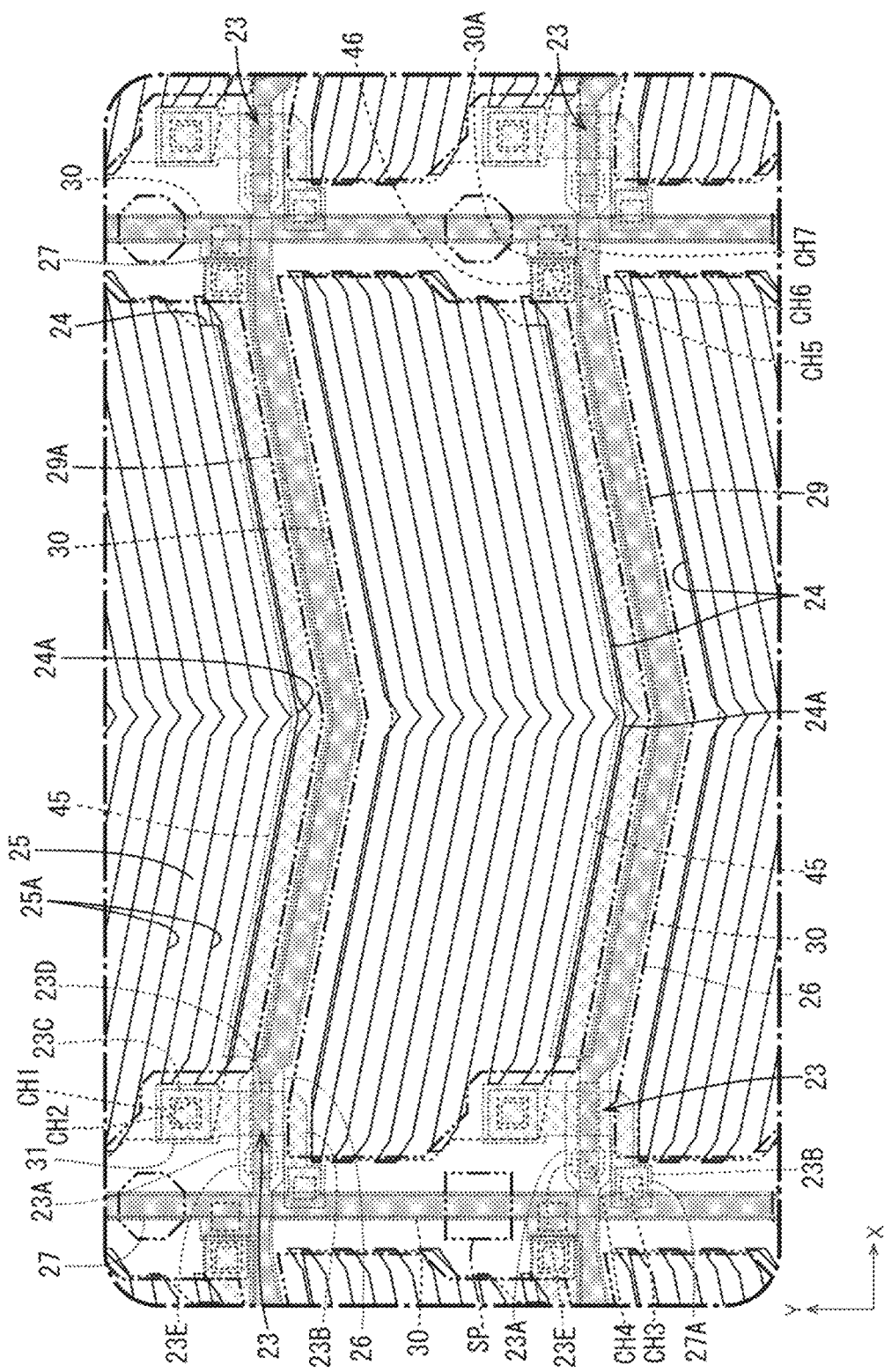
FIG. 7 is a plan view mainly illustrating a pattern of a semiconductor film and a fourth metal film provided to the array substrate.
Figure 8:
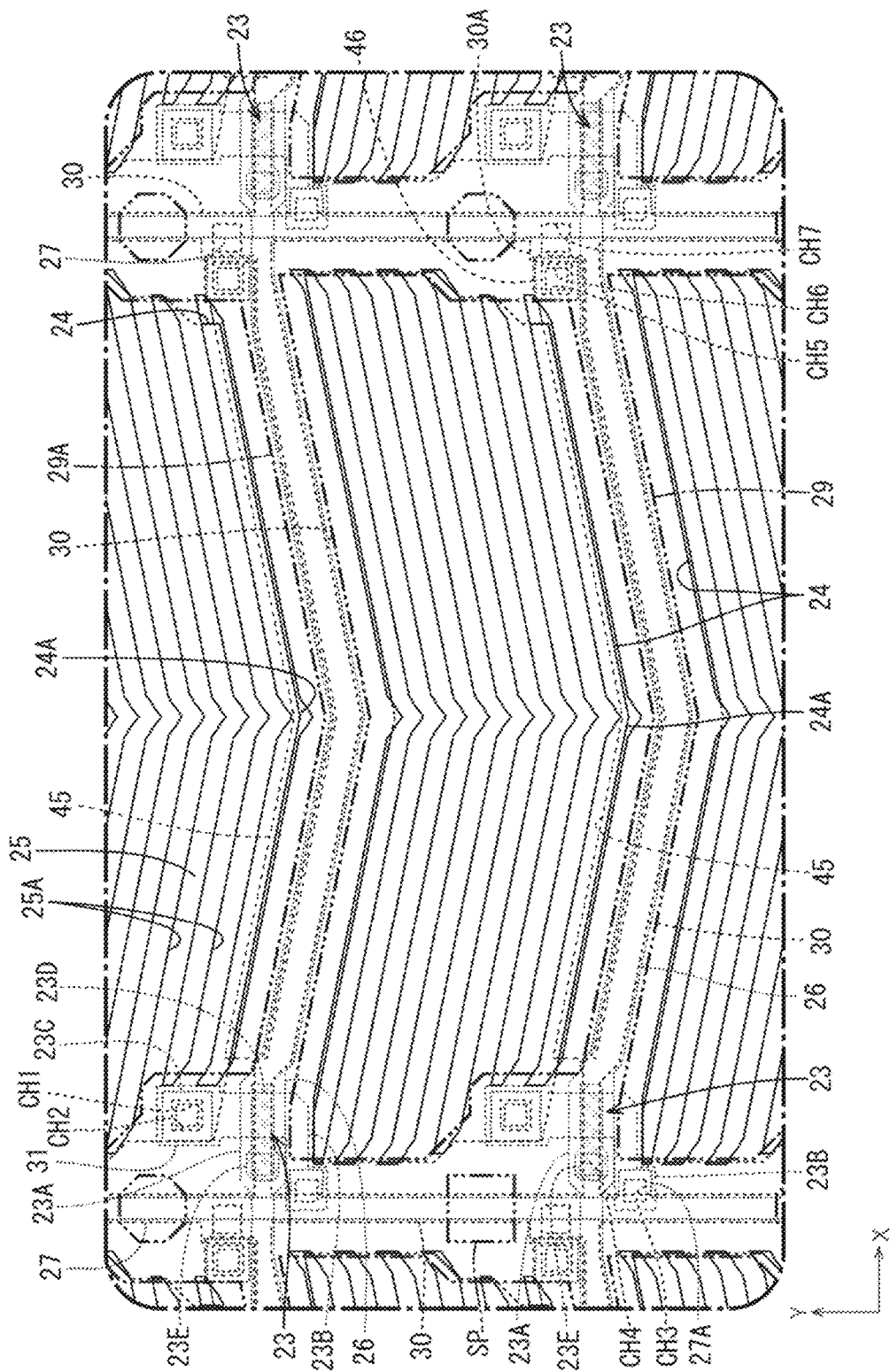
FIG. 8 is a plan view mainly illustrating a pattern of a second metal film provided to the array substrate.

The configuration of the TFT 23 will be described in detail with reference to FIG. 6 to FIG. 8. FIG. 6 is a plan view illustrating a pattern of the first gate electrode 23A, the gate line 26, the source line 27, and the like (first metal film 32 and third metal film 38 described later) of the TFT 23 provided to the array substrate 21. In FIG. 6, the first metal film 32 and the third metal film 38 are illustrated in shaded. FIG. 7 is a plan view illustrating a pattern of a channel region 23D and the like (semiconductor film 34 described later) of the TFT 23 provided to the array substrate 21. In FIG. 7, the semiconductor film 34 is illustrated in shaded. FIG. 8 is a plan view illustrating a pattern of the second gate electrode 23E (second metal film 36 described later) of the TFT 23 provided to the array substrate 21. In FIG. 8, the second metal film 36 is illustrated in shaded. As illustrated in FIG. 6, the TFT 23 includes the first gate electrode (lower layer side gate electrode) 23A made of a portion of the gate line 26. The first gate electrode 23A is made of a portion of the gate line 26 intersecting the channel region 23D. A scanning signal transmitted to the gate line 26 is supplied to the first gate electrode 23A. The TFT 23 includes the source region 23B connected to the source line 27, as illustrated in FIG. 6 and FIG. 7. The source line 27 includes a source line widened portion 27A that projects, from a position on a side (lower side illustrated in FIG. 6) opposite to the pixel electrode 24 to be connected in the Y-axis direction to the area intersecting the gate line 26, to the pixel electrode 24 side (right side illustrated in FIG. 6) to be connected in the X-axis direction. The source region 23B is substantially L-shaped in plan view, and a portion thereof extending in the X-axis direction is connected to the source line widened portion 27A described above. The TFT 23, as illustrated in FIG. 7, includes the drain region 23C disposed with an interval from the source region 23B in the Y-axis direction. The drain region 23C is connected to the pixel electrode 24 at an end portion on a side opposite to the source region 23B (channel region 23D) side. The TFT 23 includes the channel region 23D disposed overlapping the first gate electrode 23A on the upper layer side and continuous to the source region 23B and the drain region 23C. Similar to the first gate electrode 23A, the channel region 23D has a horizontally elongated quadrilateral shape in plan view, a first end portion (lower end portion illustrated in FIG. 7) in the Y-axis direction is coupled to a portion of the source region 23B extending in the Y-axis direction, and a second end portion (upper end portion illustrated in FIG. 7) is coupled to the drain region 23C.

The TFT 23 includes the second gate electrode (lower layer side gate electrode) 23E disposed overlapping the channel region 23D on the upper layer side, as illustrated in FIG. 8. Similar to the first gate electrode 23A and the channel region 23D, the second gate electrode 23E has a horizontally elongated quadrilateral shape in plan view. The second gate electrode 23E is electrically connected to the first gate electrode 23A, and thus the scanning signal transmitted to the gate line 26 is supplied at the same timing as to the first gate electrode 23A. The channel region 23D is thus configured to be sandwiched between the lower layer side and the upper layer side in the Z-axis direction by the first gate electrode 23A and the second gate electrode 23E, making it possible to increase a drain current flowing into the channel region 23D compared to when only one gate electrode is disposed overlapping the channel region 23D. As a result, the pixel electrode 24 can be sufficiently charged even when the charging time of the pixel electrode 24 charged by the TFT 23 is reduced in association with an increase in the number of installations of the gate line 26.

Figure 9:
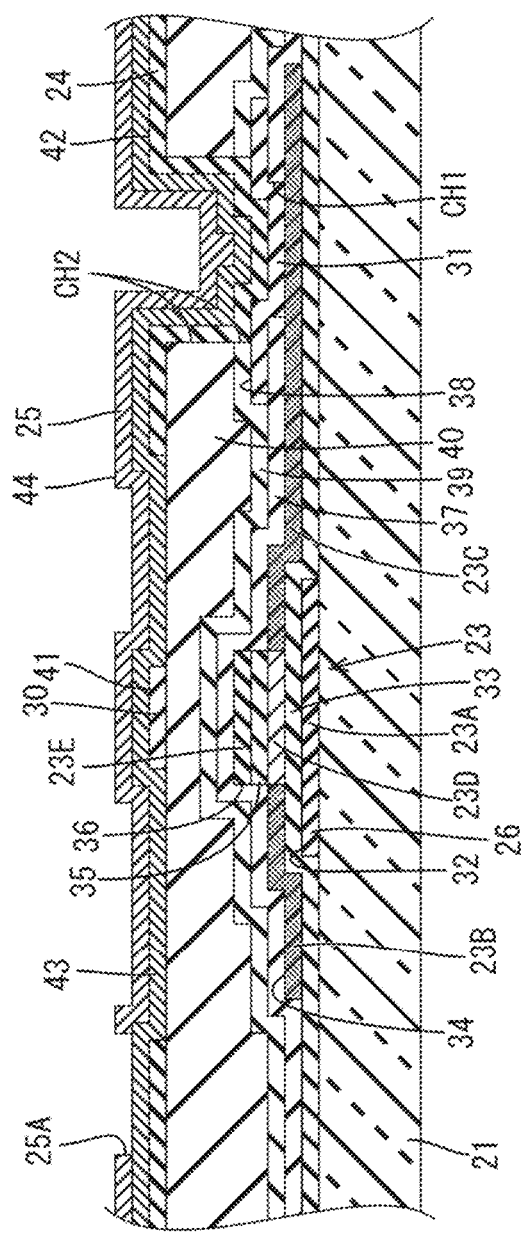
FIG. 9 is a cross-sectional view of the array substrate taken along line C-C of FIG. 2.
Figure 10:
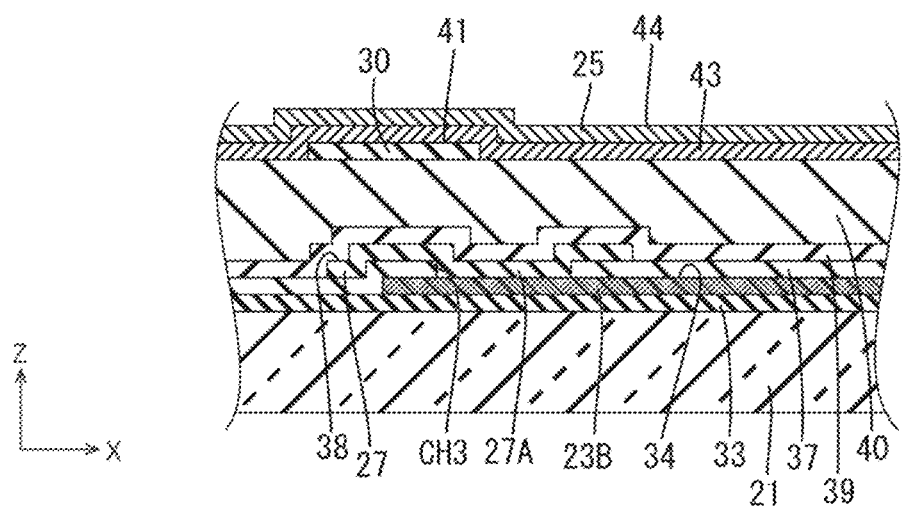
FIG. 10 is a cross-sectional view of the array substrate taken along line D-D of FIG. 2.
Figure 11:
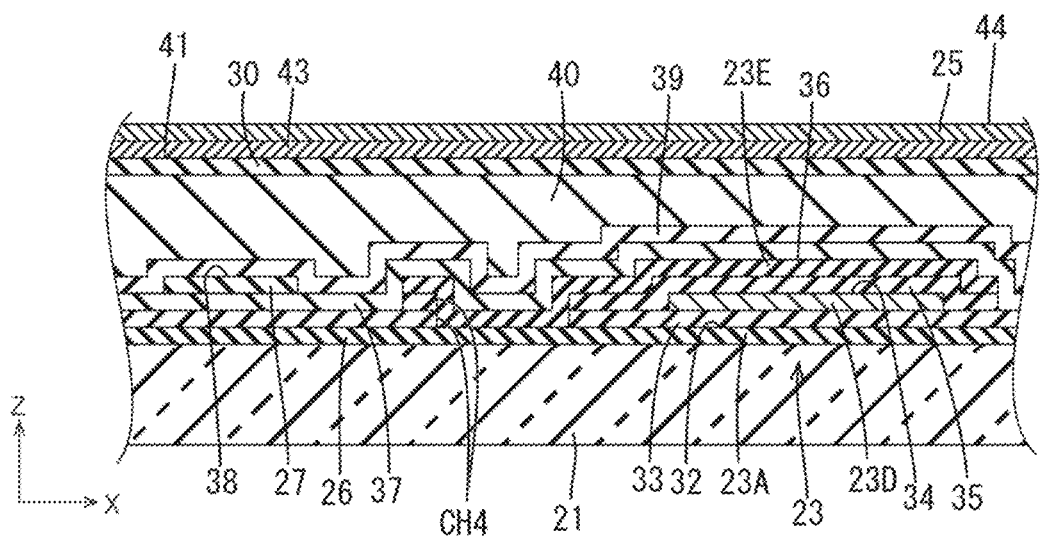
FIG. 11 is a cross-sectional view of the array substrate taken along line E-E of FIG. 2.

The various films layered and formed on the inner surface side of the array substrate 21 will now be described with reference to FIG. 9 to FIG. 11. FIG. 9 to FIG. 11 are each a cross-sectional view of the array substrate 21 near the TFT 23. As illustrated in FIG. 9 to FIG. 11, in the array substrate 21, the first metal film (conductive film) 32, a first gate insulating film (lower layer side gate insulating film) 33, the semiconductor film 34, a second gate insulating film (upper layer side gate insulating film) 35, the second metal film (conductive film) 36, a first interlayer insulating film (insulating film) 37, the third metal film (conductive film) 38, a second interlayer insulating film (insulating film) 39, a flattening film (insulating film) 40, a fourth metal film (conductive film) 41, a first transparent electrode film 42, an inter-electrode insulating film (insulating film) 43, and the second transparent electrode film 44 are layered in this order from the lower layer side (glass substrate side).

The first metal film 32, the second metal film 36, the third metal film 38, and the fourth metal film 41 are each a single layer film made of one type of metal material selected from copper, titanium, aluminum, molybdenum, tungsten, and the like, or a layered film or alloy made of a different types of metal materials, and thus have conductivity and light-blocking properties. The first metal film 32, as illustrated in FIG. 9 and FIG. 11, constitutes the gate line 26, the first gate electrode 23A of the TFT 23, and the like. The second metal film 36 constitutes the second gate electrode 23E of the TFT 23, and the like. The third metal film 38 constitutes the source line 27 as illustrated in FIG. 10 and constitutes a pixel intermediate electrode 31 connected to both the drain region 23C and the pixel electrode 24 as illustrated in FIG. 9. The pixel electrode 24 is connected to the drain region 23C by interposing this pixel intermediate electrode 31 and thus, compared to when the pixel electrode is directly connected to the drain region 23C, failure such as film breakage or the like is not readily generated in the pixel electrode 24, resulting in high connection reliability. The fourth metal film 41 constitutes the common line 30 and the like. The first transparent electrode 42 and the second transparent electrode 44 are made of a transparent electrode material (for example, indium tin oxide (ITO), indium zinc oxide (IZO), and the like). The first transparent electrode film 42 constitutes the pixel electrodes 24 and the like. The second transparent electrode film 44 constitutes the common electrode 25 and the like.

The semiconductor film 34 is an oxide semiconductor film employing an oxide semiconductor, for example, as a material, and has light-transmitting. The semiconductor film 34 constitutes the source region 23B, the drain region 23C, the channel region 23D, and the like constituting the TFT 23. Examples of specific materials of the semiconductor film 34 include an In—Ga—Zn—O based semiconductor (for example, indium gallium zinc oxide). Here, the In—Ga—Zn—O based semiconductor is a ternary oxide of indium (In), gallium (Ga), and zinc (Zn), and a ratio (compositional ratio) of the In, Ga, and Zn is not particularly limited. For example, the ratio includes In:Ga:Zn=2:2:1, In:Ga:Zn=1:1:1, or In:Ga:Zn=1:1:2, but is not necessarily limited thereto. While the In—Ga—Zn—O based semiconductor may be amorphous or crystalline, when employing a crystalline, the crystalline In—Ga—Zn—O based semiconductor in which a c-axis is oriented substantially perpendicular to a layer surface is preferable. Here, in the semiconductor film 34 described above, a portion (the portion in which the second metal film 36 is non-overlapping) is made to have a reduced resistance in the manufacturing process, and thus the semiconductor film 34 is constituted by a reduced resistance region and a non-reduced resistance region. Specifically, the semiconductor film 34, after being patterned to form a predetermined planar shape, is subjected to a resistance reduction treatment with the second gate insulating film 35 and the second metal film 36 layered and formed on the upper layer side serving as masks. Of the semiconductor film 34, a portion exposed without being covered by the second metal film 36 (a portion not overlapping the second metal film 36) is the reduced resistance region, and a portion covered by the second metal film 36 (a portion overlapping the second metal film 36) is the non-reduced resistance region. Note that, in FIG. 4, FIG. 9, FIG. 10, FIG. 12, and FIG. 13, the reduced resistance region of the semiconductor film 34 is illustrated in shaded. The reduced resistance region of the semiconductor film 34 has an extremely low resistivity of, for example, from about $\frac{1}{10000000000}$ to $\frac{1}{100}$ compared to the non-reduced resistance region, and functions as a conductor. The reduced resistance region of the semiconductor film 34 constitutes the source region 23B, the drain region 23C, and the like of the TFT 23. The non-reduced resistance region of the semiconductor film 34 is capable of charge transfer only under specific conditions (when a scanning signal is supplied to each of the gate electrodes 23A and 23E), while the reduced resistance region is always capable of charge transfer and functions as a conductor. The non-reduced resistance region of the semiconductor film 34 constitutes the channel region 23D of the TFT 23.

The first gate insulating film 33, the second gate insulating film 35, the first interlayer insulating film 37, the second interlayer insulating film 39, and the inter-electrode insulating film 43 are each made of an inorganic material such as silicon nitride ($SiN_x$) or silicon oxide ($SiO_2$). The flattening film 40 is made of an organic material such as polymethyl methacrylate (PMMA; acrylic resin), for example, and has a film thickness greater than those of the other insulating films 33, 35, 37, 38 and 43 made of inorganic material. This flattening film 40 flattens the surface of the array substrate 21. As illustrated in FIG. 9 to FIG. 11, the first gate insulating film 33 keeps the first metal film 32 on the lower layer side and the semiconductor film 34 on the upper layer side in an insulated state. In particular, the interval between the first gate electrode 23A and the channel region 23D is kept constant by a portion of the first gate insulating film 33 overlapping the first gate electrode 23A. The second gate insulating film 35 keeps the semiconductor film 34 on the lower layer side and the second metal film 36 on the upper layer side in an insulated state. In particular, the interval between the second gate electrode 23E and the channel region 23D is kept constant by a portion of the second gate insulating film 35 overlapping the second gate electrode 23E. The second gate insulating film 35 is patterned along with the second metal film 36 disposed on the upper layer side, and has a formation range overlapping substantially the entire region of the second metal film 36 (excluding a gate contact hole CH4 described later). The first interlayer insulating film 37 keeps the second metal film 36 on the lower layer side and the third metal film 38 on the upper layer side in an insulated state. The second interlayer insulating film 39 and the flattening film 40 keep the third metal film 38 on the lower layer side, and the fourth metal film 41 and the first transparent electrode 42 on the upper layer side in an insulated state. The inter-electrode insulating film 43 keeps the first transparent electrode film 42 on the lower layer side and the second transparent electrode film 44 on the upper layer side in an insulated state.

As illustrated in FIG. 9, a first pixel contact hole CH1 for connecting the pixel intermediate electrode 31 to the drain region 23C is formed in a position of the first interlayer insulating film 37 overlapping both the drain region 23C and the pixel intermediate electrode 31. A second pixel contact hole CH2 for connecting the pixel electrode 24 to the pixel intermediate electrode 31 is formed in respective positions of the second interlayer insulating film 39 and the flattening film 40 overlapping both the pixel electrode 24 and the pixel intermediate electrode 31. The drain region 23C and the pixel electrode 24 are connected to the pixel intermediate electrode 31 through these pixel contact holes CH1 and CH2, respectively. The pixel intermediate electrode 31 is disposed covering, from the upper layer side, the portion of the drain region 23C made of the semiconductor film 34 that is facing the first pixel contact hole CH1, making it possible to prevent the drain region 23C from being over-etched when the fourth metal film 41 is etched through a patterned photoresist. Further, as illustrated in FIG. 10, a source contact hole CH3 for connecting the source line widened portion 27A to the source region 23B is formed in a position of the first interlayer insulating film 37 overlapping both the source line widened portion 27A of the source line 27 and the source region 23B. In addition, as illustrated in FIG. 11, the gate contact hole CH4 for connecting the second gate electrode 23E to the first gate electrode 23A is formed in positions of the first gate insulating film 33 and the second gate insulating film 35 overlapping both the first gate electrode 23A and the second gate electrode 23E and not overlapping the channel region 23D.

Figure 12:
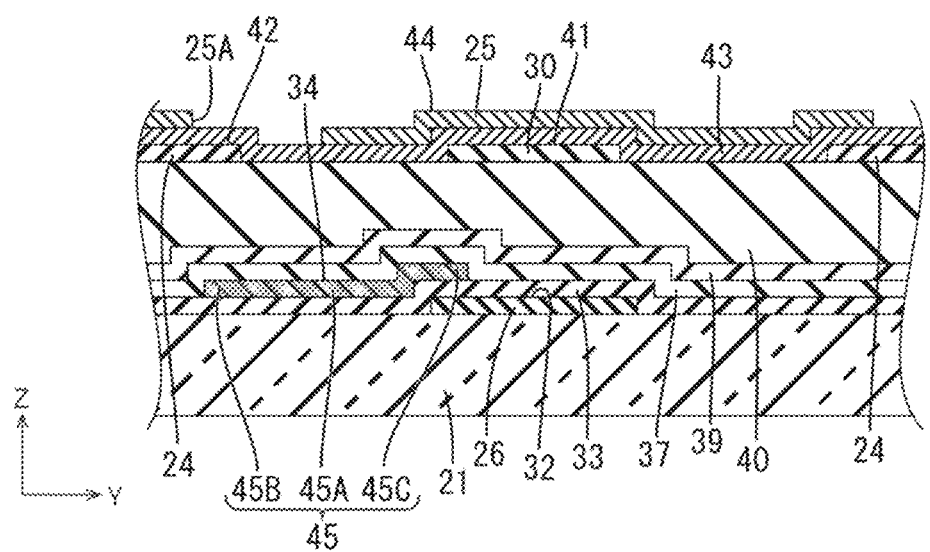
FIG. 12 is a cross-sectional view of the array substrate taken along line F-F of FIG. 2.

As illustrated in FIG. 7 and FIG. 12, the array substrate 21 according to the present embodiment is provided with a light-transmitting shielding portion 45 disposed adjacent to both the pixel electrode 24 and the gate line 26. FIG. 12 is a cross-sectional view of the array substrate 21 near the light-transmitting shielding portion 45. The light-transmitting shielding portion 45 is made of the reduced resistance region of the semiconductor film (conductive film) 34 and is always capable of being conductive. Accordingly, the light-transmitting shielding portion 45 has light-transmitting and electrical conductivity. The light-transmitting shielding portion 45 is electrically connected to the common electrode 25, which will be described in detail later. In this manner, an electrical field generated between the pixel electrode 24 and the gate line 26 can be blocked by the light-transmitting shielding portion 45 disposed adjacent to both the pixel electrode 24 and the gate line 26. As a result, a parasitic capacitance generated between the pixel electrode 24 and the gate line 26 is suppressed, and thus a reduction in display quality caused by parasitic capacitance is suppressed. In addition, because the light-transmitting shielding portion 45 is made of the semiconductor film 34 having light-transmitting, when, for example, a design is adopted in which a portion of the light-transmitting shielding portion 45 is made to overlap the pixel electrode 24 or, even with a design in which the light-transmitting shielding portion 45 does not overlap the pixel electrode 24, when a portion of the light-transmitting shielding portion 45 is disposed overlapping the pixel electrode 24 due to a shift in alignment or the like that is generated during manufacture, the amount of transmitted light of the pixel electrode 24 is less likely to decrease due to the light-transmitting shielding portion 45. This makes it possible to block an electrical field generated between the pixel electrode 24 and the gate line 26 while suppressing a luminance reduction. Furthermore, the light-transmitting shielding portion 45 is constituted by the reduced resistance region formed by reducing the resistance of a portion of the semiconductor film 34 constituting the channel region 23D of the TFT 23 that is different from the channel region 23D, and thus, during manufacture, these can be patterned using the same photomask, which is suitable for reducing the number of photomasks used and the like.

As illustrated in FIG. 7 and FIG. 12, the light-transmitting shielding portion 45 extends in parallel with the side edge portion on the longitudinal side of the pixel electrode 24 and the gate line 26. Specifically, the light-transmitting shielding portion 45 is bent once along the bent portion 24A of the pixel electrode 24 at a substantially central position in the length direction in plan view, and forms a shallow V-shape in which the apex angle is an obtuse angle. The light-transmitting shielding portion 45 has a length dimension that is somewhat shorter than the length dimension of the side edge portion on the longitudinal side of the pixel electrode 24, but is disposed adjacent to a large portion of the side edge portion on the longitudinal side of the pixel electrode 24 (a portion other than both end portions in the length direction). The light-transmitting shielding portion 45 is disposed with one end portion in the length direction (X-axis direction) adjacent to the TFT 23, and the other end portion adjacent to a portion of the common line 30 extending along the source line 27 (Y-axis direction). Further, the light-transmitting shielding portion 45 is also disposed adjacent in the Y-axis direction to the portion of the common line 30 extending along the gate line 26 (X-axis direction). In a configuration in which the gate line 26 extends along the side edge portion on the longitudinal side of the pixel electrode 24 having a longitudinal shape as in the present embodiment, compared to when the gate line extends along the side edge portion on the short-hand side of the pixel electrode 24, the parasitic capacitance that may be generated between the side edge portion on the longitudinal side of the pixel electrode 24 and the gate line 26 tends to be greater. In this regard, the light-transmitting shielding portion 45 extends along the side edge portion on the longitudinal side of the pixel electrode 24, and thus the electrical field generated between the side edge portion on the longitudinal side of the pixel electrode 24 and the gate line 26 is favorably blocked by the light-transmitting shielding portion 45, and a reduction in display quality caused by parasitic capacitance can be more effectively suppressed. Further, in a configuration in which the gate line 26 is bent along the bent portion 24A of the pixel electrode 24 as in the present embodiment, compared to when the pixel electrode and the gate line extend linearly without being bent at a middle in the longitudinal direction, the gate line 26 has an increased creepage distance parallel to the side edge portion on the longitudinal side of the pixel electrode 24, and thus the parasitic capacitance that may be generated between the side edge portion on the longitudinal side of the pixel electrode 24 and the gate line 26 tends to be even larger. In this regard, the light-transmitting shielding portion 45 is bent along the bent portion 24A of the pixel electrode 24, and thus the electrical field generated between the side edge portion on the longitudinal side of the pixel electrode 24 and the gate line 26 is favorably blocked, and a reduction in display quality caused by parasitic capacitance can be even more effectively suppressed.

As illustrated in FIG. 7 and FIG. 12, the light-transmitting shielding portion 45 has a width dimension wider than the interval between the pixel electrode 24 and the gate line 26 aligned in the Y-axis direction. The light-transmitting shielding portion 45 includes a non-overlapping portion 45A interposed between the pixel electrode 24 and the gate line 26 in the Y-axis direction (alignment direction of the pixel electrode 24 and the gate line 26), being non-overlapping with the pixel electrode 24 and the gate line 26 in plan view. The non-overlapping portion 45A has a width dimension substantially equal to the interval between the pixel electrode 24 and the gate line 26 aligned in the Y-axis direction. This non-overlapping portion 45A can favorably block an electrical field that may be generated between the pixel electrode 24 and the gate line 26 through the space opened between the pixel electrode 24 and the gate line 26. In addition, the light-transmitting shielding portion 45 includes a pixel electrode overlapping portion 45B disposed overlapping the side edge portion on the longitudinal side of the pixel electrode 24 in plan view. The pixel electrode overlapping portion 45B made of the semiconductor film 34 overlaps the side edge portion on the longitudinal side of the pixel electrode 24 made of the first transparent electrode film 42 with the first interlayer insulating film 37, the second interlayer insulating film 39, and the flattening film 40 interposed therebetween. In this way, even when there is an electrical field that may be generated between the pixel electrode 24 and the gate line 26 near the side edge portion on the longitudinal side of the pixel electrode 24, the electrical field can be favorably blocked by the pixel electrode overlapping portion 45B overlapping the side edge portion on the longitudinal side of the pixel electrode 24. Moreover, because the light-transmitting shielding portion 45 has light-transmitting, the amount of transmitted light of the pixel electrode 24 is less likely to decrease due to the pixel electrode overlapping portion 45B and luminance reduction is suppressed even when the pixel electrode overlapping portion 45B overlaps the pixel electrode 24. Further, even when, for example, the light-transmitting shielding portion 45 is positionally offset away from the pixel electrode 24 in the Y-axis direction due to a shift in alignment that is generated during manufacture or the like, the pixel electrode overlapping portion 45B can block an electrical field that may be generated in the space opened between the pixel electrode 24 and the gate line 26. This increases the reliability of blocking an electrical field that may be generated between the pixel electrode 24 and the gate line 26 by the light-transmitting shielding portion 45.

Furthermore, the light-transmitting shielding portion 45, as illustrated in FIG. 7 and FIG. 12, includes a gate line overlapping portion (pixel line overlapping portion) 45C disposed overlapping the side edge portion of the gate line 26 in plan view. The gate line overlapping portion 45C made of the semiconductor film 34 overlaps the side edge portion of the gate line 26 made of the first metal film 32 with the first gate insulating film (insulating film) 33 interposed therebetween. In this way, even when there is an electrical field that may be generated between the gate line 26 and the pixel electrode 24 near the side edge portion of the gate line 26, the electrical field can be favorably blocked by the gate line overlapping portion 45C overlapping the side edge portion of the gate line 26. Further, even when, for example, the light-transmitting shielding portion 45 is positionally offset away from the gate line 26 in the Y-axis direction due to a shift in alignment that is generated during manufacture or the like, the gate line overlapping portion 45C can block an electrical field that may be generated in the space opened between the pixel electrode 24 and the gate line 26. This increases the reliability of blocking an electrical field that may be generated between the pixel electrode 24 and the gate line 26 by the light-transmitting shielding portion 45. Further, the semiconductor film 34 constituting the light-transmitting shielding portion 45 is disposed on the upper layer side of the gate line 26 with the first gate insulating film 34 interposed therebetween, making it possible to avoid a situation in which the gate line overlapping portion 45C of the light-transmitting shielding portion 45 overlapping the side edge portion of the gate line 26 is no longer reduced in resistance by the gate line 26.

Figure 13:
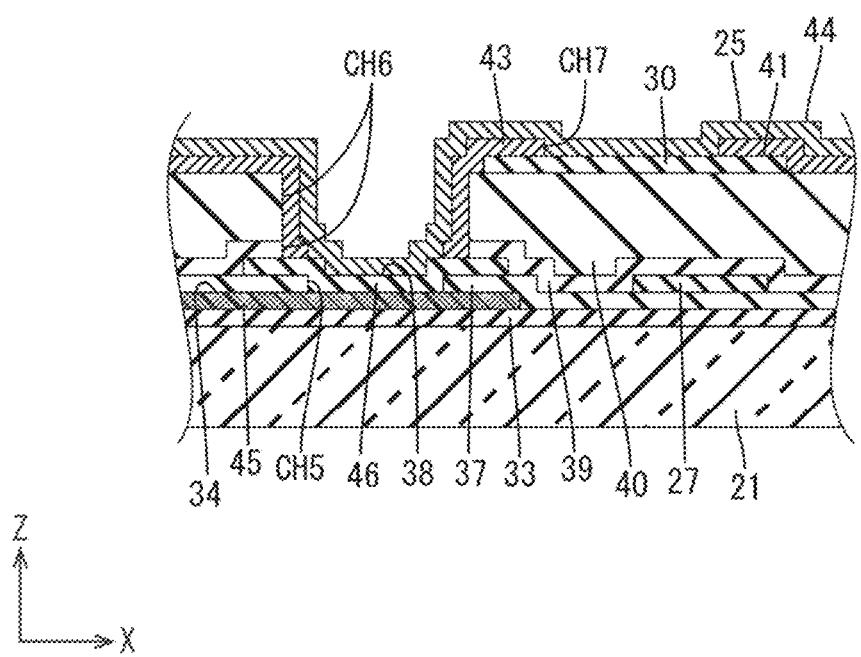
FIG. 13 is a cross-sectional view of the array substrate taken along line G-G of FIG. 2.

Next, a connection structure between the light-transmitting shielding portion 45 and the common electrode 25 will be described. As illustrated in FIG. 6 and FIG. 13, the light-transmitting shielding portion 45 made of the semiconductor film 34 and the common electrode 25 made of the second transparent electrode film 44 are electrically connected by interposing an intermediate electrode 46 made of the third metal film 38. FIG. 13 is a cross-sectional view of the array substrate 21 near the intermediate electrode 46. The intermediate electrode 46 is disposed overlapping the light-transmitting shielding portion 45 on the upper layer side with the first interlayer insulating film 37 interposed therebetween, and overlapping the common electrode 25 on the lower layer side with the second interlayer insulating film 39, the flattening film 40, and the inter-electrode insulating film 43 interposed therebetween. Specifically, the intermediate electrode 46 is disposed overlapping an end portion of the light-transmitting shielding portion 45 on a side (right side illustrated in FIG. 6) opposite to the TFT 23 side in the length direction (X-axis direction) in plan view, and connects that same end portion to the common electrode 25. A first shielding portion contact hole (contact hole) CH5 for connecting the intermediate electrode 46 to the above-described end portion of the light-transmitting shielding portion 45 is formed in a position of the first interlayer insulating film 37 overlapping the intermediate electrode 46. A second shielding portion contact hole CH6 for connecting the common electrode 25 to the intermediate electrode 46 is formed in positions of the second interlayer insulating film 39, the flattening film 40, and the inter-electrode insulating film 43 overlapping the intermediate electrode 46. The common electrode 25 and the light-transmitting shielding portion 45 are connected to the intermediate electrode 46 through these shielding portion contact holes CH5 and CH6, respectively. The intermediate electrode 46 is disposed covering, from the upper layer side, the portion of the light-transmitting shielding portion 45 made of the semiconductor film 34 that is facing the first shielding portion contact hole CH5, making it possible to prevent the light-transmitting shielding portion 45 from being over-etched when the fourth metal film 41 is etched through a patterned photoresist. Further, the common electrode 25 and the light-transmitting shielding portion 45 are connected by interposing this intermediate electrode 46 and thus, compared to when the common electrode is directly connected to the light-transmitting shielding portion 45, failure such as film breakage or the like is not readily generated in the common electrode 25, resulting in high connection reliability.

Further, as illustrated in FIG. 7 and FIG. 13, the portion of the common line 30 extending along the source line 27 includes a common line widened portion 30A partially widened at a position adjacent to the light-transmitting shielding portion 45. Then, a common line contact hole CH7 for connecting the common electrode 25 to the common line widened portion 30A is formed in a position of the inter-electrode insulating film 43 interposed between the common electrode 25 and the common line 30 that is overlapping both the common electrode 25 and the common line widened portion 30A.

As described above, the liquid crystal panel (display device) 11 of the present embodiment includes the pixel electrode 24, the TFT (switching element) 23 connected to the pixel electrode 24, the gate line (pixel line) 26 connected to the TFT 23 and disposed adjacent to the pixel electrode 24, and the light-transmitting shielding portion 45 that is made of a semiconductor film (conductive film) 34 having light-transmitting and is disposed adjacent to both the pixel electrode 24 and the gate line 26.

In this way, a signal for driving the TFT 23 or a signal for charging the pixel electrode 24 is transmitted to the gate line 26, and the pixel electrode 24 is charged in accordance with the driving of the TFT 23. Between the pixel electrode 24 and the gate line 26, a parasitic capacitance may be generated, and there is a concern that the display quality may deteriorate due to this parasitic capacitance. For this, the light-transmitting shielding portion 45 is disposed adjacent to both the pixel electrode 24 and the gate line 26, making it possible to block an electrical field generated between the pixel electrode 24 and the gate line 26 by the light-transmitting shielding portion 45. As a result, a parasitic capacitance generated between the pixel electrode 24 and the gate line 26 is suppressed, and thus a reduction in display quality caused by parasitic capacitance is suppressed. In addition, because the light-transmitting shielding portion 45 is made of the semiconductor film 34 having light-transmitting, when, for example, a design is adopted in which a portion of the light-transmitting shielding portion 45 is made to overlap the pixel electrode 24 or, even with a design in which the light-transmitting shielding portion 45 does not overlap the pixel electrode 24, when a portion of the light-transmitting shielding portion 45 is disposed overlapping the pixel electrode 24 due to a shift in alignment or the like that is generated during manufacture, the amount of transmitted light of the pixel electrode 24 is less likely to decrease due to the light-transmitting shielding portion 45. This makes it possible to block an electrical field generated between the pixel electrode 24 and the gate line 26 while suppressing a luminance reduction.

Further, the TFT 23 includes at least the channel region 23D made of a portion of a semiconductor film 34, and the light-transmitting shielding portion 45 is formed by reducing a resistance of a portion of the semiconductor film 34, the portion being different from the channel region 23D. In this way, the light-transmitting shielding portion 45 formed by reducing the resistance of a portion of the semiconductor film 34 different from the channel region 23D is disposed adjacent to both the pixel electrode 24 and the gate line 26. The light-transmitting shielding portion 45 is made of a portion of the semiconductor film 34 constituting the channel region 23D of the TFT 23 that is different from the channel region 23D, and thus, during manufacture, these can be patterned using the same photomask, which is suitable for reducing the number of photomasks used and the like.

Further, the gate line 26 is disposed aligned with the pixel electrode 24 with an interval therebetween, and the light-transmitting shielding portion 45 includes the non-overlapping portion 45A interposed between and not overlapping the pixel electrode 24 and the pixel line 26 in an alignment direction of the pixel electrode 24 and the pixel line 26. When the pixel electrode 24 and the gate line 26 are aligned with an interval therebetween, there is a possibility that an electrical field may be generated between the pixel electrode 24 and the gate line 26 through the space opened between the pixel electrode 24 and the gate line 26. The non-overlapping portion 45A included in the light-transmitting shielding portion 45 is interposed between and in the alignment direction of the pixel electrode 24 and the gate line 26 and does not overlap the pixel electrode 24 or the gate line 26, and thus can favorably block an electrical field that may be generated in the space opened between the pixel electrode 24 and the gate line 26.

Further, the light-transmitting shielding portion 45 includes the pixel electrode overlapping portion 45B overlapping an edge portion of the pixel electrode 24 with the first interlayer insulating film 37, the second interlayer insulating film 39, and the flattening film 40 (insulating film) interposed therebetween. While there is an electrical field generated between the pixel electrode 24 and the gate line 26 near the edge portion of the pixel electrode 24, the electrical field can be favorably blocked by the pixel electrode overlapping portion 45B of the light-transmitting shielding portion 45. Moreover, because the light-transmitting shielding portion 45 has light-transmitting, the amount of transmitted light of the pixel electrode 24 is less likely to decrease and luminance reduction is suppressed even when the pixel electrode overlapping portion 45B overlaps the pixel electrode 24 with the first interlayer insulating film 37, the second interlayer insulating film 39, and the flattening film 40 interposed therebetween. Further, even when, for example, the light-transmitting shielding portion 45 is positionally offset away from the pixel electrode 24 due to a shift in alignment that is generated during manufacture or the like, the pixel electrode overlapping portion 45B can block an electrical field that may be generated in the space opened between the pixel electrode 24 and the gate line 26. This increases the reliability of blocking an electrical field that may be generated between the pixel electrode 24 and the gate line 26 by the light-transmitting shielding portion 45.

Further, the light-transmitting shielding portion 45 includes the gate line overlapping portion (pixel electrode overlapping portion) 45C overlapping an edge portion of the gate line 26 with the first gate insulating film (insulating film) 33 interposed therebetween. In this way, while there is an electrical field generated between the gate line 26 and the pixel electrode 24 near the edge portion of the gate line 26, the electrical field can be favorably blocked by the gate line overlapping portion 45C of the light-transmitting shielding portion 45. Further, even when, for example, the light-transmitting shielding portion 45 is positionally offset away from the gate line 26 due to a shift in alignment that is generated during manufacture or the like, the gate line overlapping portion 45C can block an electrical field that may be generated in the space opened between the pixel electrode 24 and the gate line 26. This increases the reliability of blocking an electrical field that may be generated between the pixel electrode 24 and the gate line 26 by the light-transmitting shielding portion 45.

Further, the TFT 23 includes at least the channel region 23D made of a portion of the semiconductor film 34 disposed on an upper layer side of the gate line 26 with the first gate insulating film (insulating film) 33 interposed therebetween, and the light-transmitting shielding portion 45 is formed by reducing a resistance of a portion of the semiconductor film 34, the portion being different from the channel region 23D. In this way, the light-transmitting shielding portion 45 formed by reducing the resistance of a portion of the semiconductor film 34 different from the channel region 23D is disposed adjacent to both the pixel electrode 24 and the gate line 26. The light-transmitting shielding portion 45 is made of a portion of the semiconductor film 34 constituting the channel region 23D of the TFT 23 that is different from the channel region 23D, and thus, during manufacture, these can be patterned using the same photomask, which is suitable for reducing the number of photomasks used and the like. Then, the semiconductor film 34 is disposed on the upper layer side of the gate line 26 with the first gate insulating film 34 interposed therebetween, making it possible to avoid a situation in which the portion of the light-transmitting shielding portion 45 overlapping the edge portion of the gate line 26 is no longer reduced in resistance by the gate line 26.

Further, the pixel electrode 24 has a longitudinal shape, and the gate line 26 and the light-transmitting shielding portion 45 extend along an edge portion on the longitudinal side of the pixel electrode 24. In a configuration in which the gate line 26 thus extends along the edge portion on the longitudinal side of the pixel electrode 24 having a longitudinal shape, compared to when the gate line extends along the edge portion on the short-hand side of the pixel electrode 24, the parasitic capacitance that may be generated between the edge portion on the longitudinal side of the pixel electrode 24 and the gate line 26 tends to be greater. In this regard, the light-transmitting shielding portion 45 extends along the edge portion on the longitudinal side of the pixel electrode 24, and thus the electrical field generated between the edge portion on the longitudinal side of the pixel electrode 24 and the gate line 26 is favorably blocked, and a reduction in display quality caused by parasitic capacitance can be more effectively suppressed.

Further, the pixel electrode 24 includes the bent portion 24A at a middle of the pixel electrode 24 in the longitudinal direction, and the gate line 26 and the light-transmitting shielding portion 45 are bent along the bent portion 24A. In a configuration in which the gate line 26 is thus bent along the bent portion 24A of the pixel electrode 24, compared to when the pixel electrode and the gate line extend linearly without being bent at a middle in the longitudinal direction, the gate line 26 has an creepage distance parallel to the edge portion on the longitudinal side of the pixel electrode 24, and thus the parasitic capacitance that may be generated between the edge portion on the longitudinal side of the pixel electrode 24 and the gate line 26 tends to be even larger. In this regard, the light-transmitting shielding portion 45 is bent along the bent portion 24A of the pixel electrode 24, and thus the electrical field generated between the edge portion on the longitudinal side of the pixel electrode 24 and the gate line 26 is favorably blocked, and a reduction in display quality caused by parasitic capacitance can be even more effectively suppressed.

Further, the source line (second pixel line) 27 extending in the short-hand direction of the pixel electrode 24 is provided, and the TFT 23 includes the first gate electrode 23A connected to the gate line 26, the channel region 23D disposed overlapping the first gate electrode 23A on an upper layer side with the first gate insulating film 33 interposed therebetween and made of the semiconductor film 34, the second gate electrode 23E disposed overlapping the channel region 23D on the upper layer side with the second gate insulating film 35 interposed therebetween and connected to the first gate electrode 23A, the source region 23B connected to a first end portion of the channel region 23D and the source line 27, and the drain region 23C connected to a second end portion of the channel region 23D and the pixel electrode 24. In this way, when the signal transmitted to the gate line 26 is supplied to the first gate electrode 23A and the second gate electrode 23E, the TFT 23 is driven. Then, the signal transmitted to the source line 27 is supplied to the source region 23B, and is supplied from the source region 23B to the drain region 23C via the channel region 23D. The drain region 23C is connected to the pixel electrode 24, and thus the pixel electrode 24 is charged to a potential on the basis of the signal transmitted to the source line 27. Here, in a configuration in which a plurality of the pixel electrodes 24, a plurality of the gate lines 26, and a plurality of the source lines 27 are provided, the arrangement interval of the plurality of the source lines 27 is greater than the arrangement interval of the plurality of the gate lines 26, and the number of installations of the plurality of the gate lines 26 tends to be greater than the number of installations of the plurality of the source lines 27. As a result, the driving time of the TFT 23 driven on the basis of the signal supplied to the gate line 26 as well as the charging time of the pixel electrode 24 charged by the TFT 23 tend to be shortened. In this regard, the TFT 23 is driven by the first gate electrode 23A disposed overlapping the channel region 23D on the lower layer side with the first gate insulating film 33 disposed therebetween, and the second gate electrode 23E disposed overlapping the channel region 23D on the upper layer side with the second gate insulating film 35 disposed therebetween and connected to the first gate electrode 23A, making it possible to increase the current flowing into the channel region 23D compared to when only one gate electrode is disposed overlapping the channel region 23D. This makes it possible to sufficiently charge the pixel electrode 24 even with a short charging time.

Further, the source line 27 is disposed with the first interlayer insulating film (insulating film) 37 interposed between the source line 27 and the second gate electrode 23E, and is made of the third metal film 38, which is a conductive film different from that of the second gate electrode 23E. In this way, compared to when the source line and the second gate electrode are constituted by the same conductive film, a defect in which the source line 27 and the second gate electrode 23E are short-circuited is less likely to be generated.

Further, the common electrode 25 overlapping the pixel electrode 24 with the inter-electrode insulating film (insulating film) 43 interposed therebetween is provided, and the light-transmitting shielding portion 45 is connected to the common electrode 25. In this way, the common electrode 25 overlapping the pixel electrode 24 with the inter-electrode insulating film 43 interposed therebetween is held at a common potential. A potential difference is generated between the charged pixel electrode 24 and the common electrode 25, and the display is made on the basis of the potential difference. The light-transmitting shielding portion 45 is connected to the common electrode 25 and is at the same potential as the common electrode 25, and thus can favorably block an electrical field that may be generated between the pixel electrode 24 and the gate line 26.

Second Embodiment

The second embodiment of the present disclosure will be described with reference to FIG. 14 to FIG. 16. In this second embodiment, an embodiment additionally provided with a second shielding portion 47 is illustrated. Note that redundant descriptions of structures, actions, and effects similar to those of the first embodiment described above will be omitted.

Figure 14:
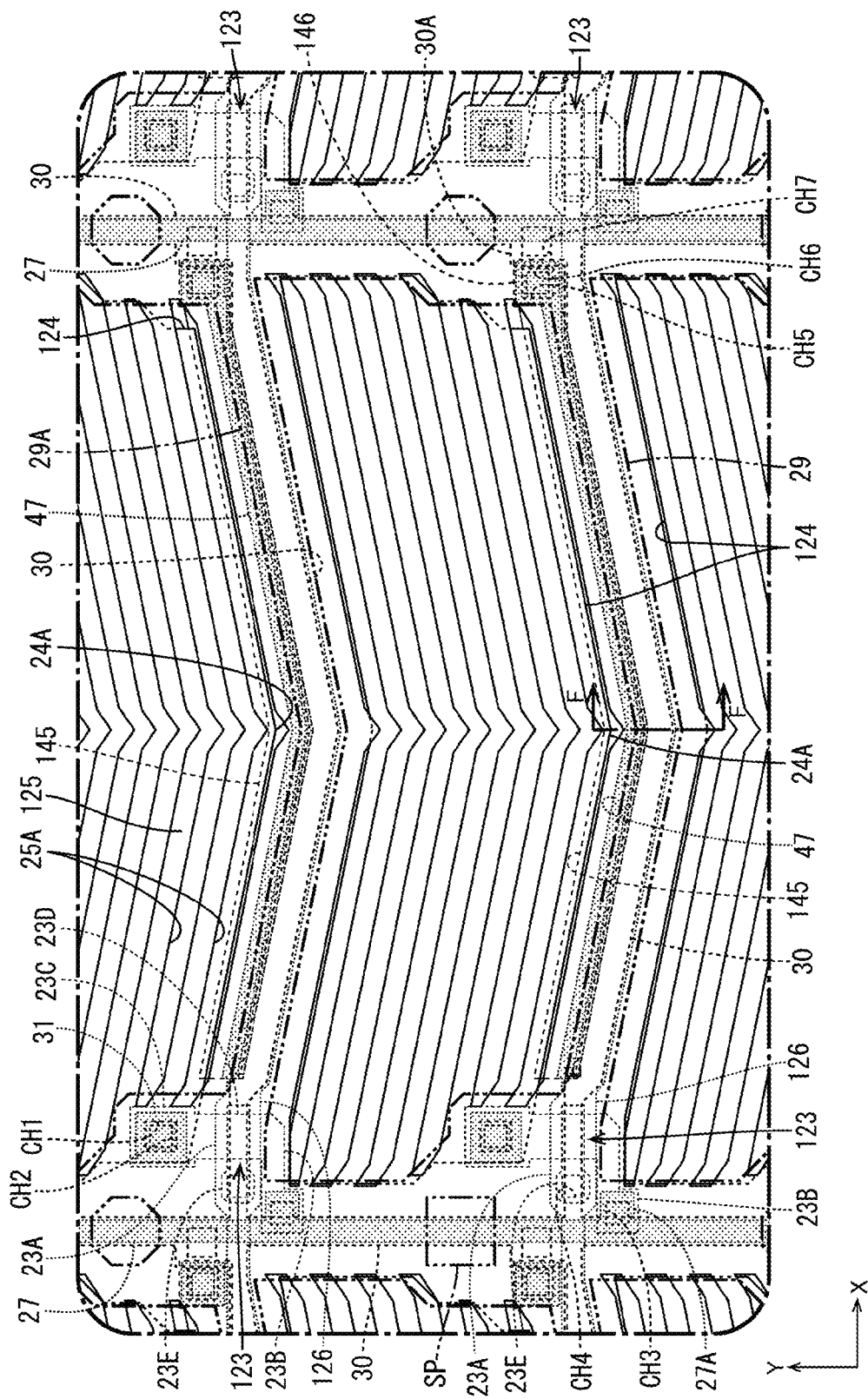
FIG. 14 is a plan view mainly illustrating a pattern of the third metal film provided to the array substrate constituting the liquid crystal panel according to a second embodiment of the present disclosure.
Figure 16:
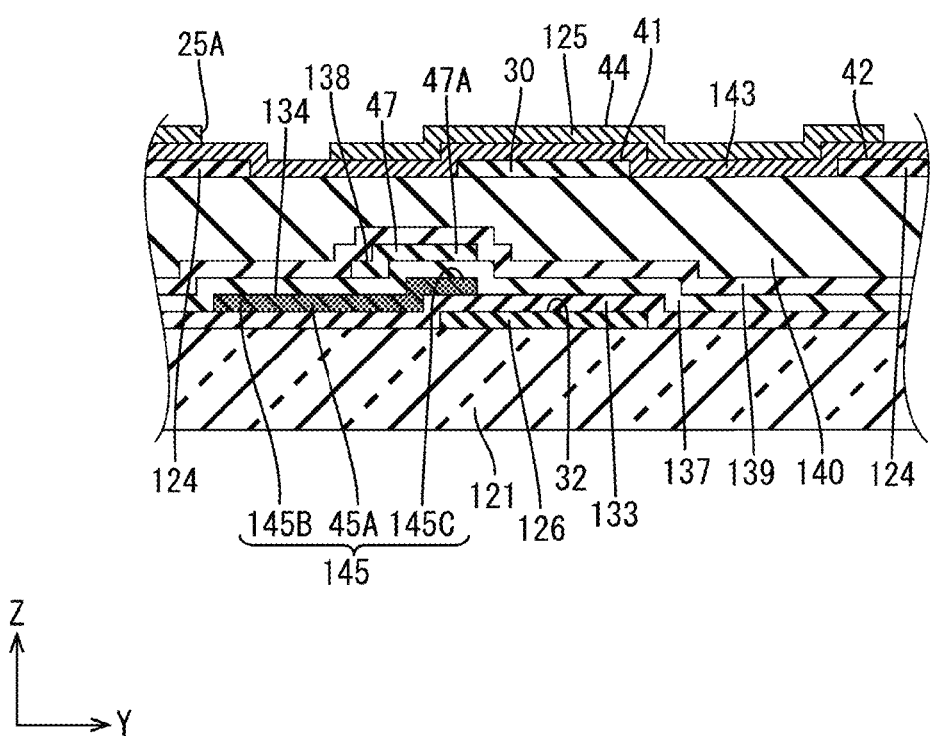
FIG. 16 is a cross-sectional view of the array substrate taken along line F-F of FIG. 14.

As illustrated in FIG. 14 and FIG. 16, an array substrate 121 according to the present embodiment is provided with a second shielding portion 47 disposed overlapping at least a portion of a light-transmitting shielding portion 145. The second shielding portion 47 is constituted by a third metal film (conductive film) 138 disposed on the upper layer side of a semiconductor film 134 constituting the light-transmitting shielding portion 145 with a first interlayer insulating film (insulating film) 137 interposed therebetween. The second shielding portion 47 extends parallel to the light-transmitting shielding portion 145, and a length dimension thereof is equivalent to a length dimension of the light-transmitting shielding portion 145. In this way, in addition to the light-transmitting shielding portion 145, the second shielding portion 47 is disposed adjacent to both a pixel electrode 124 and a gate line 126, and thus, even if a formation defect is generated in the light-transmitting shielding portion 145 made of the semiconductor film 134 for manufacturing reasons, an electrical field that may be generated between the pixel electrode 124 and the gate line 126 can be blocked by the second shielding portion 47 made of the third metal film 138.

The second shielding portion 47, as illustrated in FIG. 14 and FIG. 16, is disposed with a portion thereof overlapping a side edge portion of the gate line 126 in plan view. The third metal film 138 constituting the second shielding portion 47 has light-blocking properties, and thus the portion of the second shielding portion 47 overlapping the side edge portion of the gate line 126 is referred to as a "light-blocking gate line overlapping portion (light-blocking pixel line overlapping portion) 47A". The light-blocking gate line overlapping portion 47A overlaps the side edge portion of the gate line 126 with a first gate insulating film 133 and the first interlayer insulating film 137 (insulating film) interposed therebetween. The second shielding portion 47 is disposed not overlapping the pixel electrode 124. In this way, even when there is an electrical field that may be generated between the gate line 126 and the pixel electrode 124 near the edge portion of the gate line 126, the electrical field can be favorably blocked by the light-blocking gate line overlapping portion 47A of the second shielding portion 47. While the light-blocking gate line overlapping portion 47A overlaps the gate line 126, the second shielding portion 47 constituted by the third metal film 138 having light-blocking properties does not overlap the pixel electrode 124, and thus a decrease in the amount of transmitted light of the pixel electrode 124 is avoided. Further, even when, for example, the second shielding portion 47 is positionally offset away from the gate line 126 due to a shift in alignment that is generated during manufacture or the like, the light-blocking gate line overlapping portion 47A can block an electrical field that may be generated in the space opened between the pixel electrode 124 and the gate line 126.

Figure 15:
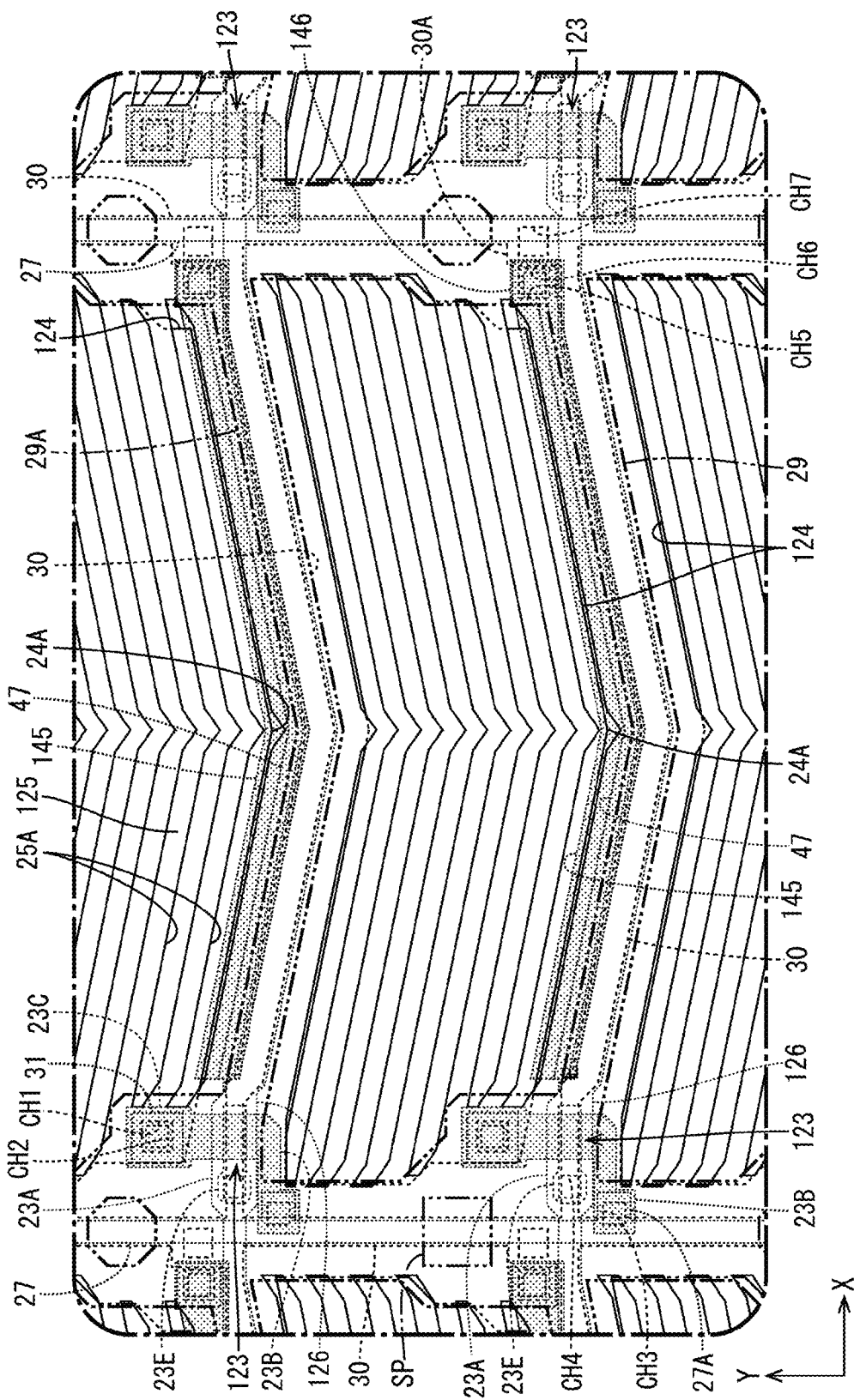
FIG. 15 is a plan view mainly illustrating a pattern of the semiconductor film provided to the array substrate.

In contrast, similar to the first embodiment described above, the light-transmitting shielding portion 145, as illustrated in FIG. 15 and FIG. 16, is disposed with portions thereof respectively overlapping the side edge portion on the longitudinal side of the pixel electrode 124 and the side edge portion of the gate line 126. The semiconductor film 134 constituting the light-transmitting shielding portion 145 has light-transmitting and thus the portion of the light-transmitting shielding portion 145 overlapping the side edge portion on the longitudinal side of the pixel electrode 124 is referred to as a "light-transmitting pixel electrode overlapping portion 145B", and the portion overlapping the side edge portion of the gate line 126 is referred to as a "light-transmitting gate line overlapping portion (light-transmitting pixel line overlapping portion) 145C". This light-transmitting pixel electrode overlapping portion 145B is the same as the pixel electrode overlapping portion 45B described in the first embodiment described above, and the light-transmitting gate line overlapping portion 145C is the same as the gate line overlapping portion 45C described in the first embodiment described above. The light-transmitting pixel electrode overlapping portion 145B overlaps the side edge portion on the longitudinal side of the pixel electrode 124 with the first interlayer insulating film 137, a second interlayer insulating film 139, and a flattening film 140 (insulating film) interposed therebetween. Further, the light-transmitting gate line overlapping portion 145C overlaps the side edge portion of the gate line 126 with the first gate insulating film 133 interposed therebetween. In this way, even when there is an electrical field that may be generated between the pixel electrode 124 and the gate line 126 near the edge portion of the pixel electrode 124, the electrical field can be favorably blocked by the light-transmitting pixel electrode overlapping portion 145B of the light-transmitting shielding portion 145. Moreover, because the light-transmitting shielding portion 145 has light-transmitting, the amount of transmitted light of the pixel electrode 124 is less likely to decrease and luminance reduction is suppressed even when the light-transmitting pixel electrode overlapping portion 145B overlaps the pixel electrode 124. Further, even when, for example, the light-transmitting shielding portion 145 is positionally offset away from the pixel electrode 124 due to a shift in alignment that is generated during manufacture or the like, the light-transmitting pixel electrode overlapping portion 145B can block an electrical field that may be generated in the space opened between the pixel electrode 124 and the gate line 126. Further, the light-transmitting gate line overlapping portion 145C is disposed overlapping the side edge portion of the gate line 126 in addition to the light-blocking gate line overlapping portion 47A of the second shielding portion 47, making it possible to more favorably block an electrical field that may be generated near the side edge portion of the gate line 126.

As illustrated in FIG. 14, the third metal film 138 constituting the second shielding portion 47 also constitutes an intermediate electrode 146. Then, the second shielding portion 47 is directly coupled to the intermediate electrode 146. Specifically, of the second shielding portion 47 extending in parallel with the light-transmitting shielding portion 145, an end portion on the side (right side illustrated in FIG. 14) opposite to the TFT 123 side in the length direction (X-axis direction) of the second shielding portion 47 is coupled to the intermediate electrode 146. The intermediate electrode 146, as described in the first embodiment described above, is connected to both a common electrode 125 and the light-transmitting shielding portion 145, making it possible to achieve effects such as a less likelihood of failure such as film breakage or the like in the common electrode 125 compared to when the common electrode is directly connected to the light-transmitting shielding portion 145, resulting in high connection reliability. Note that a connection structure of the intermediate electrode 146, the common electrode 125, and the light-transmitting shielding portion 145 (first shielding portion contact hole CH5 and second shielding portion contact hole CH6) is as set forth in FIG. 13 illustrated in first embodiment described above. Then, in the present embodiment, the second shielding portion 47 is connected to the common electrode 125 by interposing the intermediate electrode 146 along with the light-transmitting shielding portion 145, and thus the number of films can be reduced compared to when the second shielding portion and the intermediate electrode are constituted by different conductive films.

As described above, according to the present embodiment, the second shielding portion 47 made of the third metal film (conductive film) 138 disposed with at least a portion thereof overlapping the light-transmitting shielding portion 145 with the first interlayer insulating film (insulating film) 137 interposed therebetween is provided. In this way, even in a case where a formation defect is generated in the light-transmitting shielding portion 145 for manufacturing reasons, at least a portion of the second shielding portion 47 made of the third metal film 138 is disposed overlapping the light-transmitting shielding portion 145 with the first interlayer insulating film 137 interposed therebetween, making it possible to maintain the electrical field blocking function.

Further, the second shielding portion 47, in addition to being constituted by the third metal film 138 having light-blocking properties, includes a light-blocking gate line overlapping portion (light-blocking pixel line overlapping portion) 47A overlapping an edge portion of the gate line 126 with the first gate insulating film 133 and the first interlayer insulating film 137 (insulating film) interposed therebetween, and the light-transmitting shielding portion 145 includes a light-transmitting pixel electrode overlapping portion 145B overlapping an edge portion of the pixel electrode 124 with the first interlayer insulating film 137, the second interlayer insulating film 139, and the flattening film 140 (insulating film) interposed therebetween. In this way, while there is an electrical field generated between the pixel electrode 124 and the gate line 126 near the edge portion of the pixel electrode 124, the electrical field can be favorably blocked by the light-transmitting pixel electrode overlapping portion 145B of the light-transmitting shielding portion 145. Moreover, because the light-transmitting shielding portion 145 has light-transmitting, the amount of transmitted light of the pixel electrode 124 is less likely to decrease and luminance reduction is suppressed even when the light-transmitting pixel electrode overlapping portion 145B overlaps the pixel electrode 124 with the first interlayer insulating film 137, the second interlayer insulating film 139, and the flattening film 140 interposed therebetween. Further, even when, for example, the light-transmitting shielding portion 145 is positionally offset away from the pixel electrode 124 due to a shift in alignment that is generated during manufacture or the like, the light-transmitting pixel electrode overlapping portion 145B can block an electrical field that may be generated in the space opened between the pixel electrode 124 and the gate line 126. On the other hand, while there is an electrical field generated between the gate line 126 and the pixel electrode 124 near the edge portion of the gate line 126, the electrical field can be favorably blocked by the light-blocking gate line overlapping portion 47A of the second shielding portion 47. While the light-blocking gate line overlapping portion 47A overlaps the gate line 126, the second shielding portion 47 constituted by the third metal film 138 having light-blocking properties does not overlap the pixel electrode 124, and thus a decrease in the amount of transmitted light of the pixel electrode 124 is avoided. Further, even when, for example, the second shielding portion 47 is positionally offset away from the gate line 126 due to a shift in alignment that is generated during manufacture or the like, the light-blocking gate line overlapping portion 47A can block an electrical field that may be generated in the space opened between the pixel electrode 124 and the gate line 126. As a result, the reliability of blocking an electrical field that may be generated between the pixel electrode 124 and the gate line 126 by the light-transmitting shielding portion 145 and the second shielding portion 47 is increased.

Further, the common electrode 125 overlapping the pixel electrode 124 with the inter-electrode insulating film (insulating film) 143 interposed therebetween, and the intermediate electrode 146 disposed overlapping the common electrode 125 and the light-transmitting shielding portion 145, each with a different insulating film of the first interlayer insulating film 137, the second interlayer insulating film 139, the flattening film 140, and the inter-electrode insulating film 143 interposed therebetween, and connected to each of the common electrode 125 and the light-transmitting shielding portion 145 through the first shielding portion contact hole CH5 and the second shielding portion contact hole CH6 (contact hole) formed in each of the first interlayer insulating film 137, the second interlayer insulating film 139, the flattening film 140, and the inter-electrode insulating film 143 are provided. The second shielding portion 47 is made of the third metal film 138, which is the conductive film same as that of the intermediate electrode 146, and is coupled to the intermediate electrode 146. In this way, the common electrode 125 overlapping the pixel electrode 124 with the inter-electrode insulating film 143 interposed therebetween is held at a common potential. A potential difference is generated between the charged pixel electrode 124 and the common electrode 125, and the display is made on the basis of the potential difference. The first shielding portion contact hole CH5 and the second shielding portion contact hole CH6 are respectively formed in the second interlayer insulating film 139, the flattening film 140, and the inter-electrode insulating film 143, which are insulating films interposed between the common electrode 125 and the intermediate electrode 146, and in the first interlayer insulating film 137, which is an insulating film interposed between the intermediate electrode 146 and the light-transmitting shielding portion 145, and thus the common electrode 125 and the light-transmitting shielding portion 145 are connected to the intermediate electrode 146 through the first shielding portion contact hole CH5 and the second shielding portion contact hole CH6. That is, the common electrode 125 and the light-transmitting shielding portion 145 are connected via this intermediate electrode 146 and thus, compared to when the common electrode is directly connected to the light-transmitting shielding portion 145, failure such as film breakage or the like is not readily generated in the common electrode 125, resulting in high connection reliability. In addition, the second shielding portion 47 includes the third metal film 138, which is the conductive film same as that of the intermediate electrode 146, and is coupled to the intermediate electrode 146, and thus, is connected to the common electrode 125 by interposing the intermediate electrode 146 along with the light-transmitting shielding portion 145. Compared to when the second shielding portion and the intermediate electrode are constituted by different conductive films, the number of films can be reduced.

Third Embodiment

Figure 18:
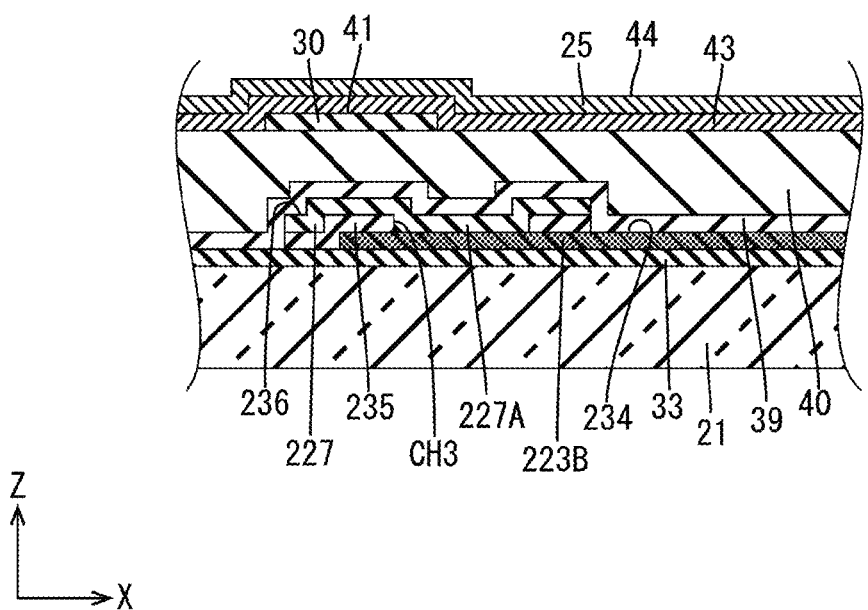
FIG. 18 is a cross-sectional view of the array substrate taken along line D-D of FIG. 17.
Figure 19:
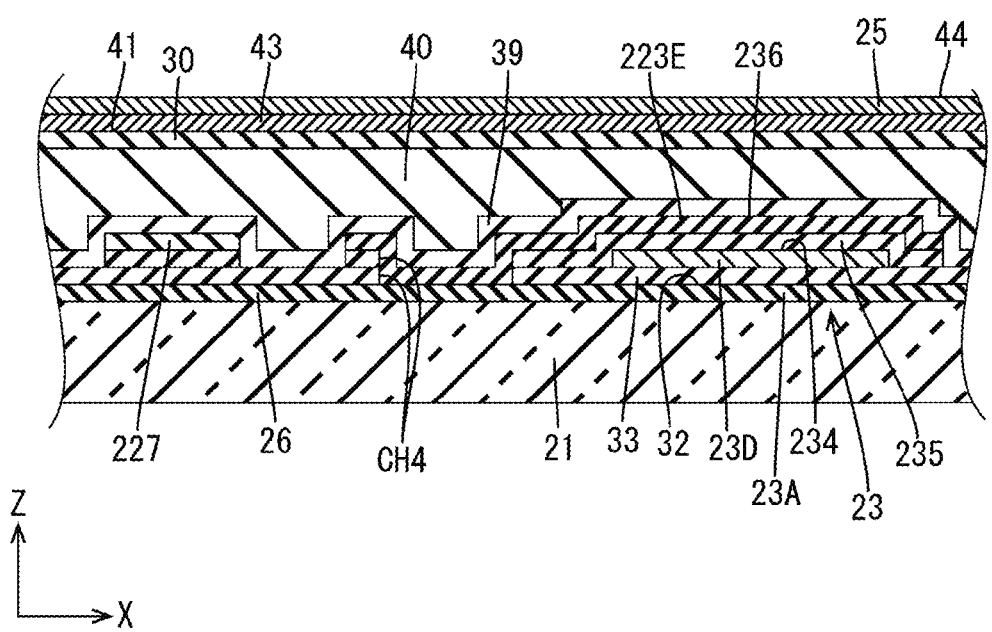
FIG. 19 is a cross-sectional view of the array substrate taken along line E-E of FIG. 17.

The third embodiment of the present invention will be described with reference to FIG. 17 to FIG. 19. In this third embodiment, a configuration of a source line 227 is changed from that of the first embodiment described above. Note that redundant descriptions of structures, actions, and effects similar to those of the first embodiment described above will be omitted.

Figure 17:
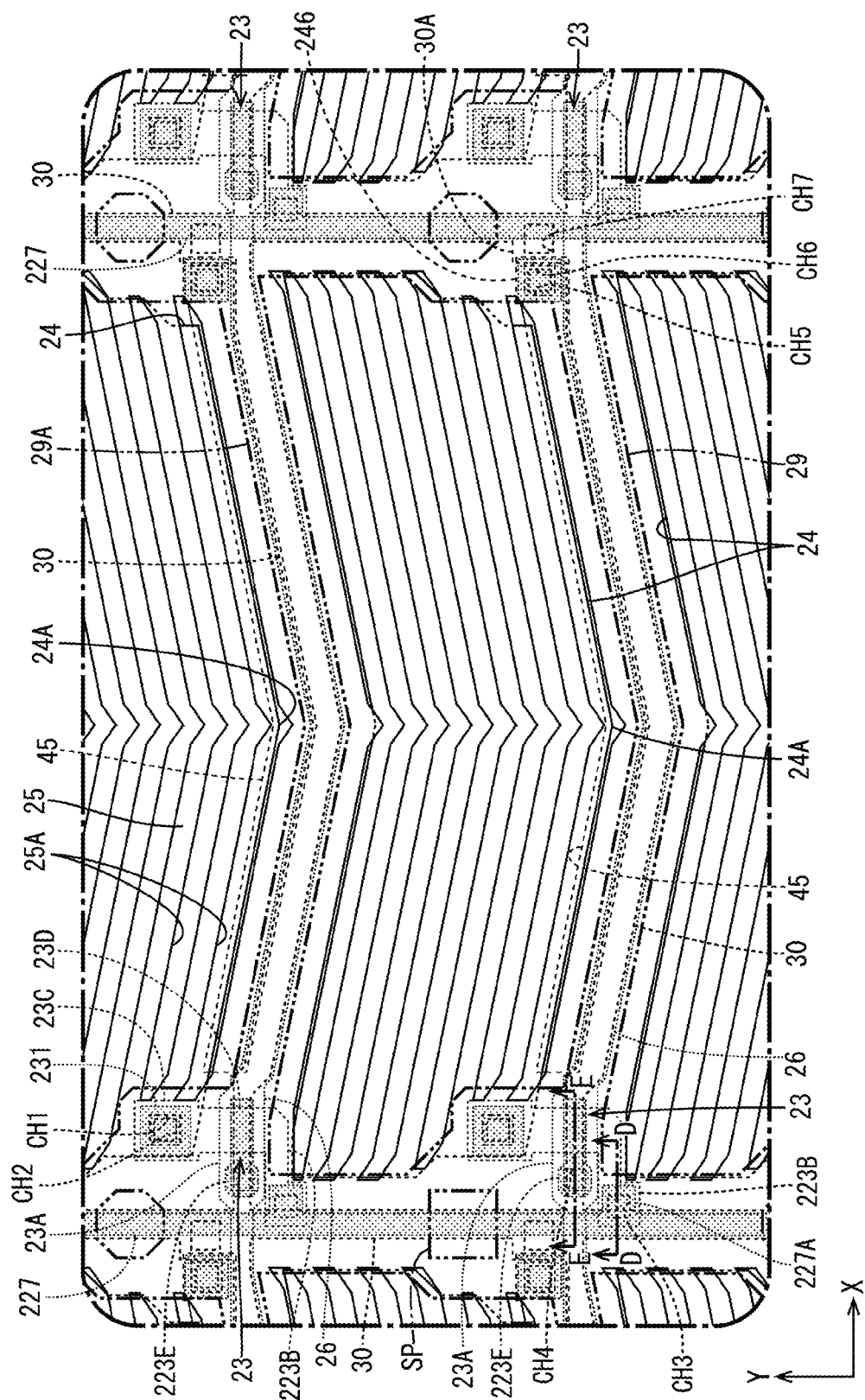
FIG. 17 is a plan view mainly illustrating a pattern of the second metal film provided to the array substrate constituting the liquid crystal panel according to a third embodiment of the present disclosure.

The source line 227 according to the present embodiment, as illustrated in FIG. 17, is formed of a second metal film 236 that is the same as that of a second gate electrode 223E. Accordingly, in the present embodiment, the third metal film 38 constituting the source line 27 in the first embodiment described above is omitted, and the first interlayer insulating film 37 disposed on the lower layer side of the third metal film 38 is omitted. A second gate insulating film 235 disposed on the lower layer side of the second metal film 236 constituting the source line 227 is patterned along with the second metal film 236, as described in the first embodiment described above. Therefore, on the lower layer side of the source line 227, as illustrated in FIG. 18 and FIG. 19, the second gate insulating film 235 is disposed overlapping substantially the entire region, excluding the gate contact hole CH4. Further, the source contact hole CH3 connecting a source line widened portion 227A of the source line 227 made of the second metal film 236 and a source region 223B made of a semiconductor film 234 is formed in the second gate insulating film 235 interposed between the semiconductor film 234 and the second metal film 236, as illustrated in FIG. 18. Further, with the third metal film 38 described in the first embodiment omitted, a pixel intermediate electrode 231 and an intermediate electrode 246 are constituted by the second metal film 236 same as that of the second gate electrode 223E and the source line 227, as illustrated in FIG. 17.

As described above, according to the present embodiment, the source line 227 is made of the second metal film 236 that is the conductive film same as that of the second gate electrode 223E. In this way, compared to when the source line and the second gate electrode are constituted by different conductive films, the number of films can be reduced.

Other Embodiments

The present disclosure is not limited to the embodiments described above and illustrated by the drawings, and embodiments such as those described below are also included within the technical scope of the present disclosure.

(1) While, in each of the embodiments described above, a configuration has been illustrated in which the light-transmitting shielding portion includes the pixel electrode overlapping portion (light-transmitting pixel electrode overlapping portion) overlapping the pixel electrode, the configuration may be one in which the light-transmitting shielding portion is disposed not overlapping the pixel electrode and the pixel electrode overlapping portion (light-transmitting pixel electrode overlapping portion) is not included.

(2) While, in each of the embodiments described above, a configuration has been illustrated in which the light-transmitting shielding portion includes the gate line overlapping portion (light-transmitting gate line overlapping portion) overlapping the gate line, the configuration may be one in which the light-transmitting shielding portion is disposed not overlapping the gate line and the gate line overlapping portion (light-transmitting gate line overlapping portion) is not included. In particular, as in the second embodiment described above, as long as the configuration includes the second shielding portion overlapping the gate line, even if the light-transmitting gate line overlapping portion is omitted, an electrical field that may be generated near the side edge portion of the gate line can be blocked by the light-blocking gate line overlapping portion of the second shielding portion.

(3) While, in each of the embodiments described above, a configuration has been illustrated in which the light-transmitting shielding portion includes the non-overlapping portion, the pixel electrode overlapping portion, and the gate line overlapping portion, the light-transmitting shielding portion may not include the pixel electrode overlapping portion and the gate line overlapping portion and only include the non-overlapping portion. Conversely, the light-transmitting shielding portion may not include the non-overlapping portion and may include at least one of the pixel electrode overlapping portion and the gate line overlapping portion. When the light-transmitting shielding portion does not include the non-overlapping portion, a configuration in which the interval between the gate line and the pixel electrode is substantially not formed is possible.

(4) While, in the second embodiment described above, a case has been illustrated in which the second shielding portion includes the light-blocking gate line overlapping portion overlapping the gate line but the second shielding portion is disposed not overlapping the pixel electrode, the second shielding portion may further include a light-blocking pixel electrode overlapping portion overlapping the pixel electrode in addition to the light-blocking gate line overlapping portion.

(5) While, in each of the embodiments described above, a case has been illustrated in which the light-transmitting shielding portion and the common line are connected to the common electrode by different connection structures, the configuration may be one in which the light-transmitting shielding portion is connected to the common line and the light-transmitting shielding portion is not directly connected to the common electrode, that is, a configuration in which the light-transmitting shielding portion is connected to the common electrode by interposing the common line. Even in this case, the common potential transmitted by the common line is supplied to each of the light-transmitting shielding portion and the common electrode.

(6) In addition to the embodiments described above, a formation range and the like of the light-transmitting shielding portion in plan view can be changed as appropriate. Further, the formation range and the like of the second shielding portion, in plan view, described in the second embodiment can be changed as appropriate.

(7) While, in each of the embodiments described above, a case has been described in which the light-transmitting shielding portion is constituted by a reduced resistance region of the semiconductor film, the light-transmitting shielding portion may be constituted by a transparent electrode film, for example, as a conductive film having light-transmitting. In this case, the transparent electrode film is added separately from the first transparent electrode film constituting the pixel electrode and the second transparent electrode film constituting the common electrode, and the transparent electrode film may be disposed on the upper layer side of the first metal film constituting the gate line and on the lower layer side of the first transparent electrode film constituting the pixel electrode.

(8) In addition to the embodiments described above, the specific planar shape of the pixel electrode can be changed as appropriate. For example, the shape may be a planar shape in which the pixel electrode is bent so as to include a plurality of bent portions. Further, the planar shape of the pixel electrode including one bent portion may be different from that illustrated in each of the drawings and, for example, the bent portion may be disposed at a position other than the central position in the longitudinal direction of the pixel electrode. In addition, the pixel electrode may have a shape without a bent portion (for example, a rectangular shape or the like). Further, the pixel electrode may have a planar shape (such as a square) that is not a longitudinal shape.

(9) While, in each of the embodiments described above, a case has been illustrated in which the ratio of the longitudinal dimension to the short-hand dimension of the pixel electrode is three, it is also possible to change the ratio of the longitudinal dimension to the short-side dimension of the pixel electrode to a value other than three. For example, when the color filters aligned in the Y-axis direction are four colors (e.g., white in addition to R, G, and B), the ratio of the longitudinal dimension to the short-side dimension of the pixel electrode may be four.

(10) In addition to the embodiments described above, the specific routing paths of the source line and the gate line can be changed as appropriate. Similarly, the specific routing paths of the common line can be changed as appropriate.

(11) While, in each of the embodiments described above, the number of installations of the gate lines is equal to the arranged number of pixel electrodes in the Y-axis direction, and the number of installations of the source lines is equal to the arranged number of pixel electrodes in the X-axis direction, the number of installations of the gate lines in the liquid crystal panel may be twice the arranged number of pixel electrodes in the Y-axis direction, and the number of the source lines may be half the arranged number of pixel electrodes in the X-axis direction.

(12) While, in each of the embodiments described above, a TFT having a double-gate structure in which the first gate electrode and the second gate electrode are respectively disposed on the lower layer side and on the upper layer side of the channel region, the TFT may have a single gate structure in which the gate electrode is selectively disposed on the lower layer side or the upper layer side of the channel region. In a TFT of a top gate type in which the pixel electrode is disposed on the upper layer side of the channel region, it is also possible to remove the first metal film illustrated in each of the embodiments and configure the gate line with the second metal film. In this case, the light-transmitting shielding portion is preferably disposed not overlapping the gate line. On the other hand, in a TFT of a bottom gate type in which the pixel electrode is disposed on the lower layer side of the channel region, it is also possible to omit the second metal film or the third metal film illustrated in each of the embodiments. In this case, the source line, the pixel intermediate electrode, and the intermediate electrode may be configured by the second metal film or the third metal film, whichever one is not omitted.

(13) In addition to each of the embodiments described above, the specific screen size, resolution, and the like of the liquid crystal panel can be changed as appropriate.

(14) In addition to each of the embodiments described above, the specific arrangement pitch of the pixel portions in the liquid crystal panel can be changed as appropriate.

(15) While, in each of the embodiments described above, a case has been illustrated in which four drivers are mounted to the array substrate, the number of drivers mounted to the array substrate can be changed as appropriate.

(16) While, in each of the embodiments described above, a case has been illustrated in which the driver is Chip-on-Glass (COG) mounted directly to the array substrate, a flexible substrate on which the driver is chip-on-film (COF) mounted may be connected to the array substrate.

(17) While, in each of the embodiments described above, the gate circuit portion is provided to the array substrate, the gate circuit portion may be omitted, and a gate driver having a function similar to that of the gate circuit portion may be mounted to the array substrate. Further, it is also possible to provide a gate circuit portion to only one side portion on one side of the array substrate.

(18) In addition to the embodiments described above, the specific planar shape of the pixel overlapping opening provided to the common electrode can be changed as appropriate. The planar shape of the pixel overlapping opening can be, for example, a W-shape, a straight line, or the like. Further, the specific number of installations, arrangement pitch, and the like of the pixel overlapping opening can be changed as appropriate.

(19) While, in each of the embodiments described above, a case has been illustrated in which the pixel overlapping opening is provided to the common electrode, conversely a common electrode overlapping opening may be provided to the pixel electrode. Further, it is also possible to make the common electrode be made of the first transparent electrode film and the pixel electrode be made of the second transparent electrode film.

(20) While, in each of the embodiments described above, a case has been illustrated in which the TFT is disposed in a planar manner in a matrix shape in the array substrate, the TFT may be disposed in a planar manner in a zigzag shape.

(21) While, in each of the embodiments described above, a case has been illustrated in which the black matrix (inter-pixel light blocking portion) is provided to the CF substrate side, the black matrix (inter-pixel light blocking portion) may be provided on the array substrate side.

(22) In addition to each of the embodiments described above, the semiconductor film constituting the channel portion of the TFT may be polysilicon. In this case, when a single gate structure is adopted, it is preferable that the TFT be a bottom gate type or a top gate type including a light-blocking film at a lower layer of the channel portion (the side on which the backlight device is installed).

(23) In addition to the embodiments described above, the display mode of the liquid crystal panel may be vertical alignment (VA) mode, twisted nematic (TN) mode, in-plane switch (IPS) mode, or the like.

(24) While, in each of the embodiments described above, a liquid crystal panel without a built-in touch panel pattern that exhibits position detection functions is illustrated, the liquid crystal panel may be an in-cell type with a built-in touch panel pattern that exhibits a position detection function.

(25) While, in each of the embodiments described above, a liquid crystal display device including a transmissive liquid crystal panel is exemplified, the liquid crystal display device may be one that includes a reflective liquid crystal panel or a semi-transmissive liquid crystal panel.

(26) While, in each of the embodiments described above, a case has been illustrated in which the planar shape of the liquid crystal display device (liquid crystal panel or backlight device) is a horizontally elongated rectangular shape, the planar shape of the liquid crystal display device may be a longitudinally elongated rectangular shape, a square shape, a circular shape, a semi-circular shape, an elliptical shape, an oblong shape, a trapezoidal shape, or the like.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
a pixel electrode;
a switching element connected to the pixel electrode;
a first pixel line connected to the switching element, the first pixel line being adjacent to the pixel electrode in a plan view; and
a light-transmitting shielding portion made of a conductive film having light-transmitting properties, the light-transmitting shielding portion being adjacent to both the pixel electrode and the first pixel line in the plan view, the light-transmitting shielding portion being disposed, in a cross-sectional view, in a layer located between the pixel electrode and the first pixel line, the light-transmitting shielding portion blocking an electrical field that occurs between the pixel electrode and the first pixel line; wherein
the light-transmitting shielding portion includes a pixel line overlapping portion which overlaps, in the plan view, only an edge portion of the first pixel line with an insulating film interposed between the pixel line overlapping portion and the edge portion of the first pixel line, and
all remaining portions of the first pixel line other than the edge portion are not overlapped by the light-transmitting shielding portion.

2. The display device according to claim 1,
wherein the switching element includes at least a channel region made of a portion of a semiconductor film, and
the light-transmitting shielding portion is formed by reducing a resistance of another portion of the semiconductor film, the another portion being different from the channel region.

3. The display device according to claim 1,
wherein the first pixel line is aligned with the pixel electrode with an interval between the first pixel line and the pixel electrode, and
the light-transmitting shielding portion includes a non-overlapping portion interposed between and not overlapping the pixel electrode and the first pixel line in an alignment direction of the pixel electrode and the first pixel line.

4. The display device according to claim 1,
wherein the light-transmitting shielding portion includes a pixel electrode overlapping portion overlapping an edge portion of the pixel electrode with an insulating film interposed between the pixel electrode overlapping portion and the edge portion of the pixel electrode.

5. The display device according to claim 1,
wherein the switching element includes at least a channel region made of a portion of a semiconductor film disposed on an upper layer side of the first pixel line with an insulating film interposed between the channel region and the first pixel line, and
the light-transmitting shielding portion is formed by reducing a resistance of another portion of the semiconductor film, the another portion being different from the channel region.

6. The display device according to claim 1,
wherein the pixel electrode has a longitudinal shape, and
the first pixel line and the light-transmitting shielding portion extend along an edge portion on a longitudinal side of the pixel electrode.

7. The display device according to claim 6,
wherein the pixel electrode includes a bent portion at a middle of the pixel electrode in a longitudinal direction, and
the first pixel line and the light-transmitting shielding portion are bent along the bent portion.

8. The display device according to claim 6, further comprising:
a second pixel line extending in a short-hand direction of the pixel electrode,
wherein the switching element includes
a first gate electrode connected to the first pixel line,
a channel region disposed overlapping the first gate electrode on an upper layer side with a first gate insulating film interposed between the channel region and the first gate electrode and made of a semiconductor film, a second gate electrode disposed overlapping the channel region on an upper layer side with the second gate insulating film interposed between the second gate electrode and the channel region, and connected to the first gate electrode, a source region connected to a first end portion of the channel region and the second pixel line, and a drain region connected to a second end portion of the channel region and the pixel electrode.

9. The display device according to claim 8, wherein the second pixel line is disposed with an insulating film interposed between the second pixel line and the second gate electrode, and is made of a conductive film different from that of the second gate electrode.

10. The display device according to claim 8, wherein the second pixel line is made of the conductive film same as that of the second gate electrode.

11. The display device according to claim 1, further comprising:

a common electrode overlapping the pixel electrode with an insulating film interposed between the common electrode and the pixel electrode, wherein the light-transmitting shielding portion is connected to the common electrode.

12. The display device according to claim 1, further comprising:

a second shielding portion disposed at least partly overlapping the light-transmitting shielding portion with an insulating film interposed between the second shielding portion and the light-transmitting shielding portion, and made of a conductive film.

13. The display device according to claim 12, wherein the second shielding portion is constituted by a conductive film having light-blocking properties, and includes a light-blocking pixel line overlapping portion overlapping an edge portion of the first pixel line with an insulating film interposed between the light-blocking pixel line overlapping portion and the edge portion of the first pixel line, and the light-transmitting shielding portion includes a light-transmitting pixel electrode overlapping portion overlapping an edge portion of the pixel electrode with an insulating film interposed between the light-transmitting pixel electrode overlapping portion and the edge portion of the pixel electrode.

14. The display device according to claim 12, further comprising:

a common electrode overlapping the pixel electrode with an insulating film interposed between the common electrode and the pixel electrode; and an intermediate electrode disposed overlapping the common electrode and the light-transmitting shielding portion via different insulating films and connected to each of the common electrode and the light-transmitting shielding portion through a contact hole formed in each of the different insulating films, wherein the second shielding portion is made of the conductive film same as that of the intermediate electrode, and is coupled to the intermediate electrode.

* * * * *